(12) United States Patent
Coon

(10) Patent No.: US 11,550,280 B2
(45) Date of Patent: Jan. 10, 2023

(54) MULTIPLE LOCATION ELECTRICAL CONTROL SYSTEM WITH SYNCHRONIZING BUTTONS

(71) Applicant: Thomas Glen Coon, Goodyear, AZ (US)

(72) Inventor: Thomas Glen Coon, Goodyear, AZ (US)

(*) Notice: Subject to any disclaimer, the term of this patent is extended or adjusted under 35 U.S.C. 154(b) by 262 days.

(21) Appl. No.: 16/826,658

(22) Filed: Mar. 23, 2020

(65) Prior Publication Data

US 2020/0218214 A1 Jul. 9, 2020

Related U.S. Application Data

(63) Continuation-in-part of application No. 16/016,424, filed on Jun. 22, 2018, now abandoned.

(60) Provisional application No. 62/535,960, filed on Jul. 23, 2017.

(51) Int. Cl.
| | |
|---|---|
| *G05B 19/042* | (2006.01) |
| *H05K 5/02* | (2006.01) |
| *H01H 13/14* | (2006.01) |
| *H03K 19/20* | (2006.01) |
| *H01R 31/06* | (2006.01) |
| *H01R 13/70* | (2006.01) |
| *H03K 3/037* | (2006.01) |

(52) U.S. Cl.
CPC ............ *G05B 19/042* (2013.01); *H01H 13/14* (2013.01); *H01R 13/70* (2013.01); *H01R 31/065* (2013.01); *H03K 3/037* (2013.01); *H03K 19/20* (2013.01); *H05K 5/0217* (2013.01); *G05B 2219/25257* (2013.01)

(58) Field of Classification Search
CPC ........ G05B 19/042; G05B 2219/25257; H01H 13/14; H01R 13/70; H01R 31/065; H01R 13/665; H01R 24/78; H03K 3/037; H03K 19/20; H05K 5/0217
See application file for complete search history.

(56) References Cited

U.S. PATENT DOCUMENTS

| | | | | |
|---|---|---|---|---|
| 3,872,319 A | * | 3/1975 | Platzer, Jr. ............. | H05B 47/10 361/160 |
| 7,663,866 B2 | * | 2/2010 | Lee ....................... | H01R 13/713 361/601 |
| 2001/0030470 A1 | * | 10/2001 | Waugh ............... | H01R 13/7038 307/114 |

* cited by examiner

*Primary Examiner* — Elim Ortiz

(57) ABSTRACT

An electrical control system which controls an electrical device from two or more locations with independent control function, the system including a wall adapter having a first integrated circuit board, a first enclosure, and a second enclosure. The first enclosure includes a first push button, a first synchronizing push button, and a second IC board electrically connected to the wall adapter; and the second enclosure includes a second push button, a second synchronizing push button, and a third IC board. Each of the wall switch, the first synchronizing push button, and the second synchronizing push button is a system power control button and part of a synchronizing circuit that synchronizes the electrical control system to default system power controls upon being pressed by a user. Each of the first and second push buttons is a local button that controls a respective controlled receptable of a respective enclosure.

20 Claims, 24 Drawing Sheets

MULTIPLE LOCATION ELECTRICAL CONTROL SYSTEM WITH SYNCHRONIZING BUTTONS

CROSS REFERENCE TO RELATED APPLICATION

The present application is a continuation in part of, and claims the benefit under 35 U.S.C. § 120, U.S. patent application Ser. No. 16/016,424 filed Jun. 22, 2018 entitled "MULTIPLE LOCATION ELECTRICAL CONTROL SYSTEM", which is related to and claims the benefit under 35 U.S.C. § 119(e) of the prior U.S. provisional application Ser. No. 62/535,960 filed Jul. 23, 2017 entitled "THREE-WAY SWITCHING DEVICE FOR CONTROLLING A LAMP FROM AN EXISTING SINGLE-POLE WALL SWITCH CONTROLLING A HALF/SPLIT-CONTROLLED WALL RECEPTACLE", the contents of which are incorporated herein by this reference in their entirety, and are not admitted to be prior art with respect to the present invention by the mention in this cross-reference section.

FIELD OF THE INVENTION

The present invention relates generally to the field of electrical control devices. In particular, the present invention relates to a device that allows a user to control at least one electrical device from two or more locations in a room utilizing an existing half/split-controlled wall receptacle powered from a single-pole or three-way wall switch.

BACKGROUND OF THE INVENTION

A need exists that allows a user to control an electrical device, for example, a lamp, from two or more locations in a room independent of the wall switch and regardless of the on or off position of the single-pole wall switch, giving the user a true three-way switch function from an existing single-pole switch controlling a wall receptacle.

For ease of installation and to limit expenses, it is desirable to have an electrical control device that can be used without requiring modifications to the existing wall switch, to the lamp, and without modifying the existing wall receptacle or any other parts of the existing wiring.

Any discussion of prior art throughout the specification should in no way be considered as an admission that such prior art is widely known or forms part of the common general knowledge in the field.

BRIEF SUMMARY OF THE INVENTION

According to the present disclosure there is provided an electrical control system configured to control an electrical device from two or more locations with independent control function, the electrical control device comprising a wall adapter, a first enclosure, and a second enclosure. The wall adapter includes a first IC board and a first set of polarized male plugs configured to provide electrical connection with a wall receptacle controlled by a single-pole wall switch. The first enclosure includes a first push button, a first synchronizing push button, and a second IC board electrically connected to the wall adapter. The second enclosure comprises a second push button, a second synchronizing push button, and a third IC board. Each of the wall switch via the wall adapter, the first synchronizing push button, and the second synchronizing push button is a system power control button and part of a synchronizing circuit configured to synchronize the electrical control system to default system power controls upon being pressed by a user. Additionally, each of the first push button and the second push button is a local button configured to control a respective controlled receptable of a respective enclosure without affecting that of another enclosure.

According to another embodiment of the current disclosure, there is an electrical control system configured to control an electrical device from two or more locations with independent control function, the electrical control system comprising a wall adapter, a first enclosure, and a second enclosure. The wall adapter comprises a first set of polarized male plugs and a first integrated circuit (IC) board, wherein the first set of polarized male plugs is configured to provide electrical connection with a wall receptacle controlled by a single-pole wall switch; wherein the first IC board comprises a first isolating optocoupler, a number of resistors, a diode, and a multiple pin connector in electrical connection; and wherein the first IC board is configured to convert a 110 vac latched signal in the wall receptacle to a 5 vdc momentary signal via the first isolating optocoupler. The first enclosure of this embodiment comprises a first push button in electrical connection with the wall adapter, a first 110 vac power cord, a first 5 vdc power supply, a first uncontrolled receptacle, a first controlled receptacle, a first multiple pin cable, a second multiple pin connector, and a second IC board; wherein the first multiple pin cable is configured to electrically connect the first enclosure at the second multiple pin connector to the wall adapter via the first multiple pin connector; wherein the second IC board comprises a second isolating optocoupler, a first TRIAC, a microcontroller, and a crystal oscillator in electrical connection with the first controlled receptacle; and wherein the first 110 vac power cord is connected at a first end to an uncontrolled power source and at a second end to the first 5 vdc power supply via the first uncontrolled receptacle. Moreover, the second enclosure comprises a second push button, a second 110 vac power cord, a second multiple pin cable, a fourth multiple pin connector, a second uncontrolled receptacle, and a second controlled receptacle in electrical connection with a third IC board; wherein the third IC board comprises a third isolating optocoupler, and a second TRIAC in electrical connection. The second multiple pin cable of this embodiment is configured to electrically connect the first enclosure at a third multiple pin connector to the second enclosure via the fourth multiple pin connector; wherein the second enclosure is configured to be controlled by the microcontroller in the second IC board; and wherein the third IC board, the second IC board, and the wall switch via the wall adapter are configured to control the second isolating optocoupler and the third isolating optocoupler, and the first TRIAC and second TRIAC that are connected to the first and second controlled receptacles in respective first and second enclosures in order to turn the electrical control system on and off.

According to yet another aspect of the present disclosure, there is provided an electrical control system configured to control an electrical device from two or more locations with independent control function, the electrical control system comprising a wall adapter, a first enclosure, and a second enclosure. The wall adapter of this embodiment comprises a first set of polarized male plugs and a first integrated circuit (IC) board, wherein the first set of polarized male plugs is configured to provide electrical connection with a wall receptacle controlled by a single-pole wall switch; wherein the first IC board comprises a first isolating optocoupler, a first dual FLIP-FLOP logic gate, a first quad NAND Schmitt trigger logic gate, a pulse generator, and a first multiple pin connector in electrical connection; and wherein the first IC board is configured to convert a 110 vac latched signal in the wall receptacle to a 5 vdc momentary signal via the first isolating optocoupler. The first enclosure comprises a first push button in electrical connection with the wall adapter, a first 110 vac power cord, a first 5 vdc power supply, a first uncontrolled receptacle, a first controlled receptacle, a first multiple pin cable, a second multiple pin connector, and a second IC board; wherein the first multiple pin cable is configured to electrically connect the first enclosure at the second multiple pin connector to the wall adapter via the first multiple pin connector; wherein the second IC board comprises a second isolating optocoupler, a first TRIAC, a second dual FLIP-FLOP logic gate, a second quad NAND Schmitt trigger logic gate, a number of resistors, and multiple diodes in electrical connection with the first controlled receptacle; and wherein the first 110 vac power cord is connected at a first end to an uncontrolled power source and at a second end to the first 5 vdc power supply via the first uncontrolled receptacle. Additionally, the second enclosure of this embodiment comprises a second push button, a second 110 vac power cord, a second multiple pin cable, a second uncontrolled receptacle, and a second controlled receptacle in electrical connection with a third IC board; wherein the third IC board comprises a third dual FLIP-FLOP logic gate, a third quad NAND Schmitt trigger logic gate, a third isolating optocoupler, and a second TRIAC in electrical connection; wherein the second multiple pin cable is configured to electrically connect the first enclosure at a third multiple pin connector to the second enclosure via the fourth multiple pin connector; and wherein the third IC board, the second IC board, and the wall switch via the wall adapter are configured to control the second isolating optocoupler and the third isolating optocoupler, and the first TRIAC and second TRIAC that are connected to the first and second controlled receptacles in respective first and second enclosures in order to turn the electrical control system on and off.

BRIEF DESCRIPTION OF THE DRAWINGS

The preferred embodiment of the present invention will now be described, by way of example only, with reference to the accompanying drawings in which.

DETAILED DESCRIPTION OF THE INVENTION

The foregoing and other objectives, features, and advantages of the invention will be more readily understood upon consideration of the following description of the invention taken in conjunction with the accompanying drawings.

In the instant disclosure, the terms controlled and uncontrolled are related to the electrical conductivity of an outlet and/or switch. Controlled is defined herein as a conductor that is controlled by an electrical switch. Uncontrolled is defined herein as a conductor that is not controlled by an electrical switch. A split/half-controlled circuit is defined herein as a circuit with one controlled conductor and one uncontrolled conductor. For the purposes of the instant disclosure, a wire may contain multiple separate conductive elements, called conductors. Further, as described herein, the term wire is used to describe a single or multi-conductor cable. A multiple-pin cable may be a four-pin cable, an eight-pin cable, or any other multiple-pin cable. Similarly, for purposes of this disclosure, a multiple-pin connector may be a four-pin connector, an eight-pin connector, or any other multiple-pin connector configured to accept or allow for insertion of a multiple-pin cable.

Figure 1:
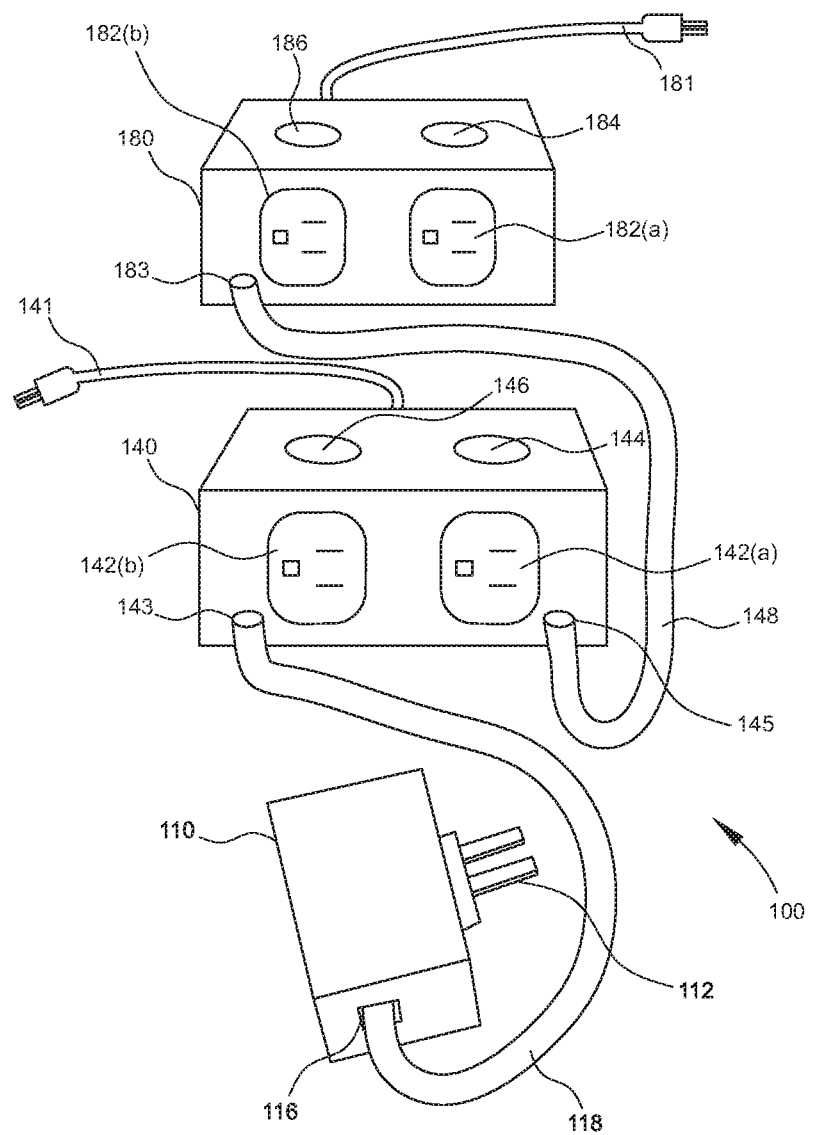
FIG. 1 illustrates an electrical control system according to an embodiment of the disclosure.
Figure 2A:
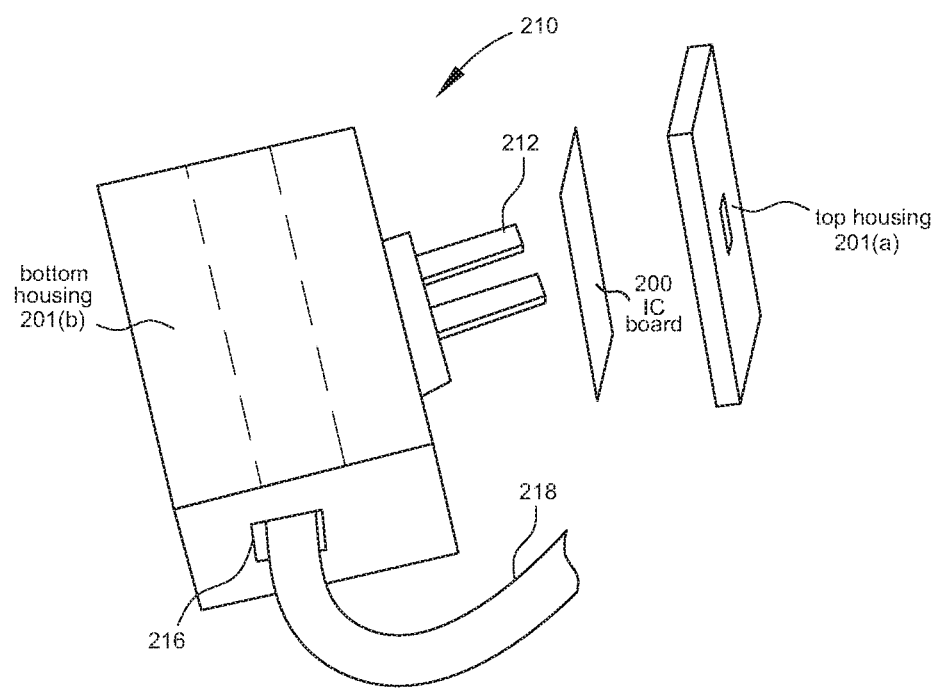
FIG. 2A illustrates an isolated, exploded view of a wall adapter for the electrical control system of FIG. 1 according to an embodiment of the disclosure.
Figure 3A:
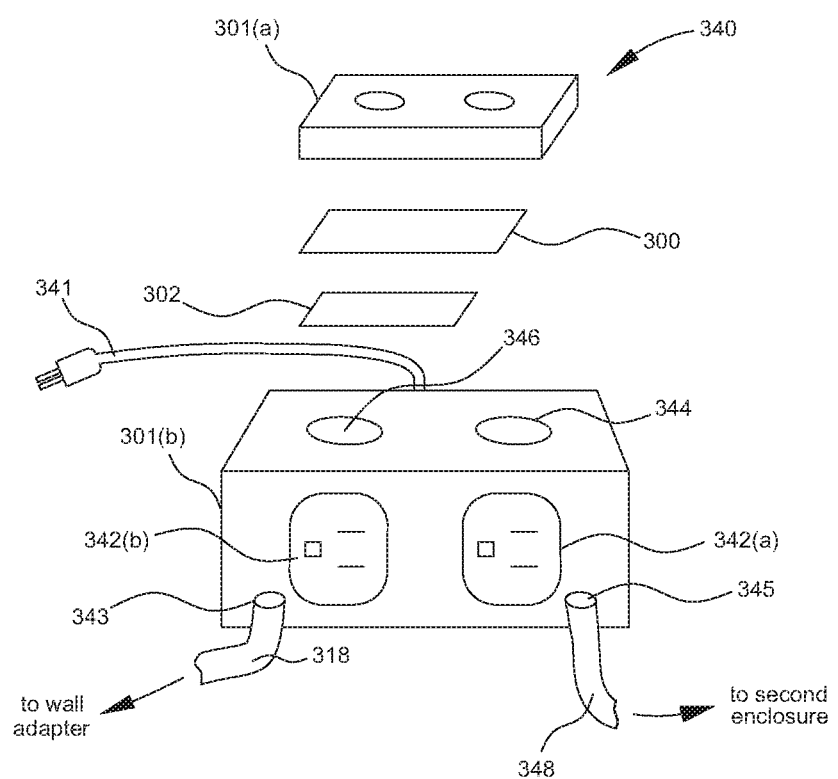
FIG. 3A illustrates an isolated, exploded view of a first enclosure for the electrical control system of FIG. 1 according to an embodiment of the disclosure.
Figure 4A:
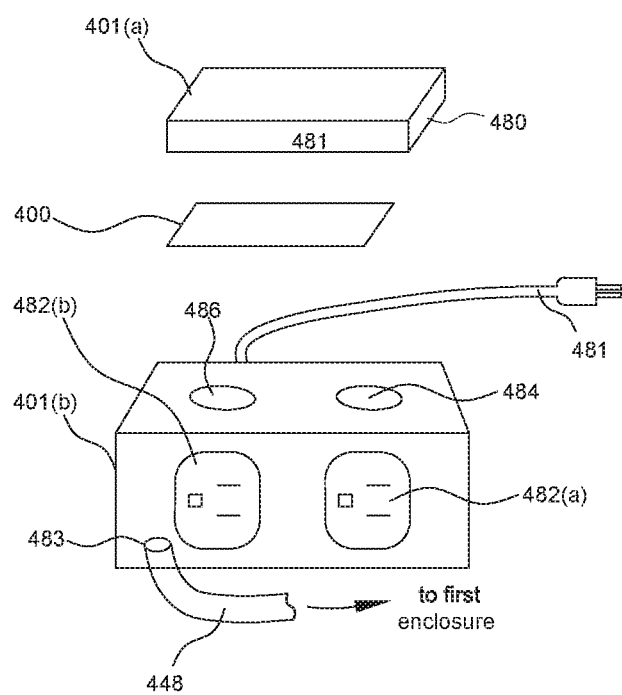
FIG. 4A illustrates an isolated, exploded view of a second enclosure for the electrical control system of FIG. 1 according to an embodiment of the disclosure.

Referring now to FIG. 1, an electrical control system 100 is configured to control an electrical device (e.g. a lamp) from two or more locations with independent control function. FIG. 2A illustrates an isolated, exploded view of a wall adapter as in the electrical control system of FIG. 1 according to an embodiment of the disclosure. FIG. 3A illustrates an isolated, exploded view of a first enclosure as in the electrical control system of FIG. 1 according to an embodiment of the disclosure; and similarly, FIG. 4A illustrates an isolated, exploded view of a second enclosure as in the electrical control system of FIG. 1 according to an embodiment of the disclosure. Accordingly, FIG. 2A, FIG. 3A, and FIG. 4A will be discussed as they relate and correlate to the electrical control system of FIG. 1.

As illustrated in FIG. 1, FIG. 2A, FIG. 3A, and FIG. 4A, electrical control system 100 includes a wall adapter 110/210, a first enclosure 140/340, and a second enclosure 180/480. Wall adapter 110/210 includes a housing 201, an integrated circuit board 200 (further detailed in FIG. 2B and FIG. 2D), and a set of polarized male plugs 112/212 which are configured to provide electrical connection with a wall receptacle controlled by a single-pole wall switch. Wall adapter 110/210 is electrically connected to the first enclosure 140/340 via a multiple pin cable 118/218/318 which attaches the wall adapter 110/210 at multiple pin connector 116/216 to the first enclosure 140/340 at multiple pin connector 143/343.

In an embodiment of the disclosure, the multiple pin cable 118/218/318 may be a 4-pin cable that is hardwired at one end to the integrated circuit board 200 of the wall adapter 110/210 rather than being connected via multiple pin connector 116/216.

As shown in FIG. 1 and FIG. 3A, the first enclosure 140/340 includes a housing 301, a 110-vac power cord 141/341, a controlled receptacle 142(a)/342(a), and an uncontrolled receptacle 142(b)/342(b). The 110-vac power cord 141 is connected at a first end to an uncontrolled power source (not shown) and at a second end to a 5 vdc power supply via the uncontrolled receptacle 142(b). The first enclosure 140 further includes a push button 144/344 in electrical connection with the wall adapter 110 and an integrated circuit board 300 (as further detailed in FIG. 3B and FIG. 3D). A synchronizing push button 146/346 is further included in the first enclosure 140/340.

In an embodiment, the 5 vdc power supply is located within the first enclosure housing 301 and is disposed on a separate board 302 from the IC board 300. The power supply may be a standard and/or generic 5 vdc power supply having 5 vdc(+) and 5 vdc(−) hard wired from the power supply to the IC board of the first enclosure. In an embodiment, board 302 may also include a USB charging port (not shown).

As shown in FIG. 1 and FIG. 4A, multiple pin cable 148/448 is configured to electrically connect the first enclosure 140/340 at multiple pin connector 145/345 to the second enclosure 180/480 via the multiple pin connector 183/483. Second enclosure 180/480 includes a housing 400, a push button 184/484, a 110 vac power cord 181/481, an uncontrolled receptacle 182(b)/482(b), and a controlled receptacle 182(a)/482(a) in electrical connection with an IC board 400 (as further detailed in FIG. 4B and FIG. 4D). Second enclosure 180/480 may further include a synchronizing push button 186/486.

According to various embodiments of the disclosure, push button 144/344 of the first enclosure and push button 184/484 of the second enclosure are each configured to operate as a local button which controls a respective controlled receptacle of a respective enclosure without affecting that of another enclosure. That is, when a user pushes push button 144/344, controlled receptacle 142(a)/342(a) is controlled by the user with no affect on the second enclosure. Similarly, when a user pushes push button 184/484, controlled receptacle 182(a)/482(a) is controlled by the user with no affect on the first enclosure or any devices plugged into it.

According to various embodiments, synchronizing push button 146/346 of the first enclosure and synchronizing push button 186/486 of the second enclosure are each configured to operate as a system power control button and part of a synchronizing circuit configured to synchronize the electrical control system upon being pressed by a user. Stated differently, when a user presses the wall switch via the wall adapter (110/210) or the synchronizing push button (146/346) of the first enclosure 140/340, the electrical control system is configured to synchronize a first amount of power to the first controlled receptacle 142(a)/342(a) and a second amount of power to the second controlled receptacle 182(a)/482(a) to normal system power controls. When the synchronizing push button 186/486 of the second enclosure is pressed, a similar function is performed, but a third enclosure is required to be included in the synchronizing circuit, as will be discussed regarding FIG. 5.

Figure 2B:
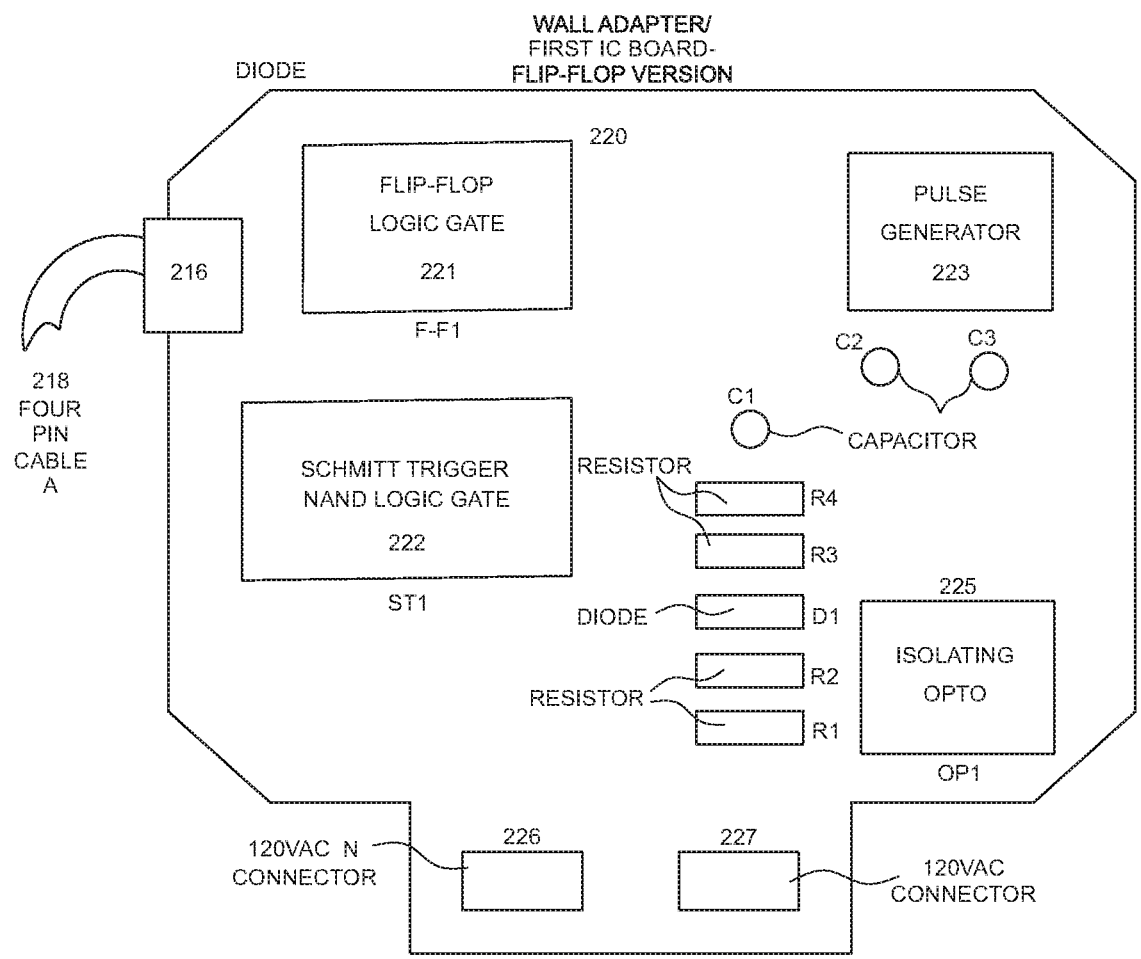
FIG. 2B illustrates a wall adapter integrated circuit (IC) board of the wall adapter of FIG. 2A according to an embodiment of the disclosure.

Referring now to FIG. 2B, an embodiment of wall adapter 210 of FIG. 2A may include an IC board having a diode, flip-flop functionality as described herein. More particularly, as shown in FIG. 2B, the IC board 220 of wall adapter 210 includes a dual Flip-Flop logic gate 221, a quad Schmitt trigger NAND logic gate 222, a pulse generator 223, an isolating optocoupler 225, and a multiple pin cable 218 configured to connect multiple pin connector 216 of IC board 220 of the wall adapter to the first enclosure. IC board 220 further includes a 120 vac N connector 226 and a 120 vac connector 227 which facilitate the connection to the polarized male plus that inset into the controlled wall receptacle. As one of ordinary skill in the art would know, the "N" connector is the neutral side of the 110 vac circuit. IC board 220 also includes three capacitors C1, C2, and C3, one diode D1, and four resistors R1, R2, R3, and R4. As shown here, IC board 220 is configured to convert a 110 vac latched signal in the wall receptacle to a 5 vdc momentary signal via the isolating optocoupler 225.

Figure 2C:
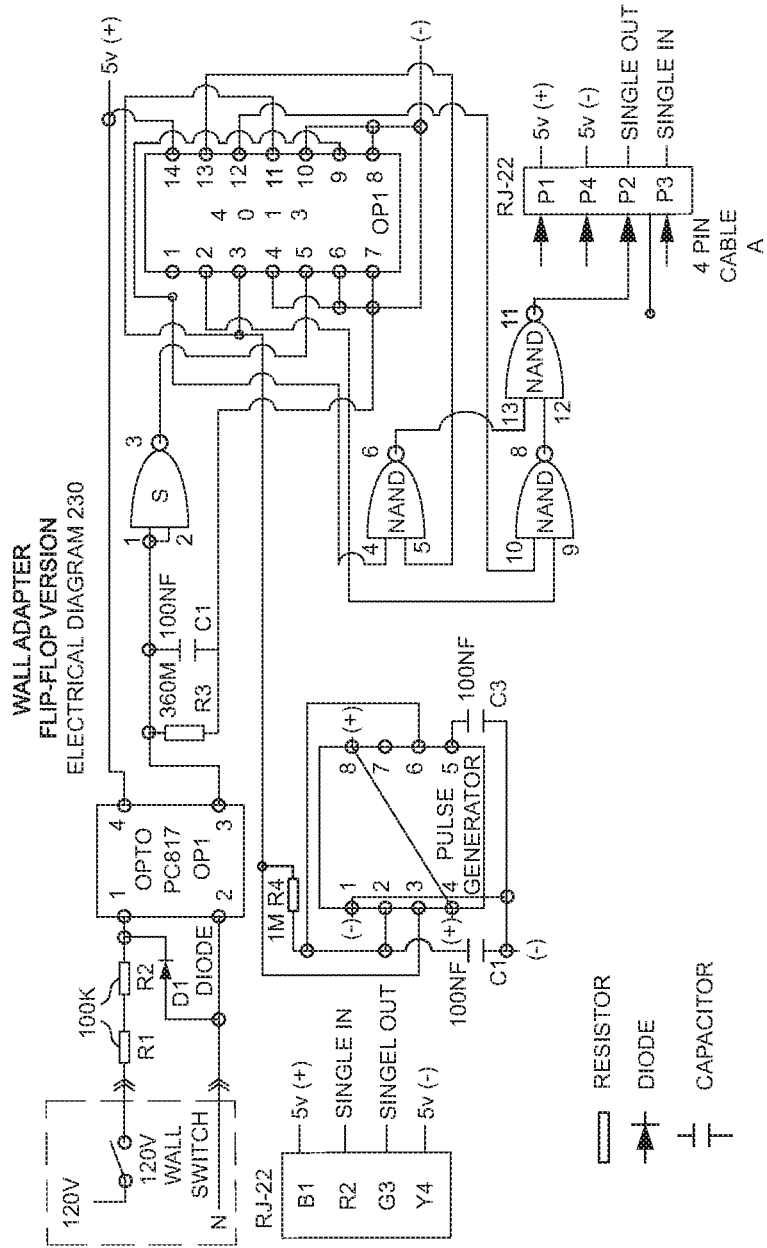
FIG. 2C illustrates an electrical diagram of the wall adapter IC board of FIG. 2B according to an embodiment of the disclosure.

FIG. 2C illustrates an electrical diagram 230 of the IC board 220 of FIG. 2B, as one of ordinary skill in the art would understand and follow.

Figure 2D:
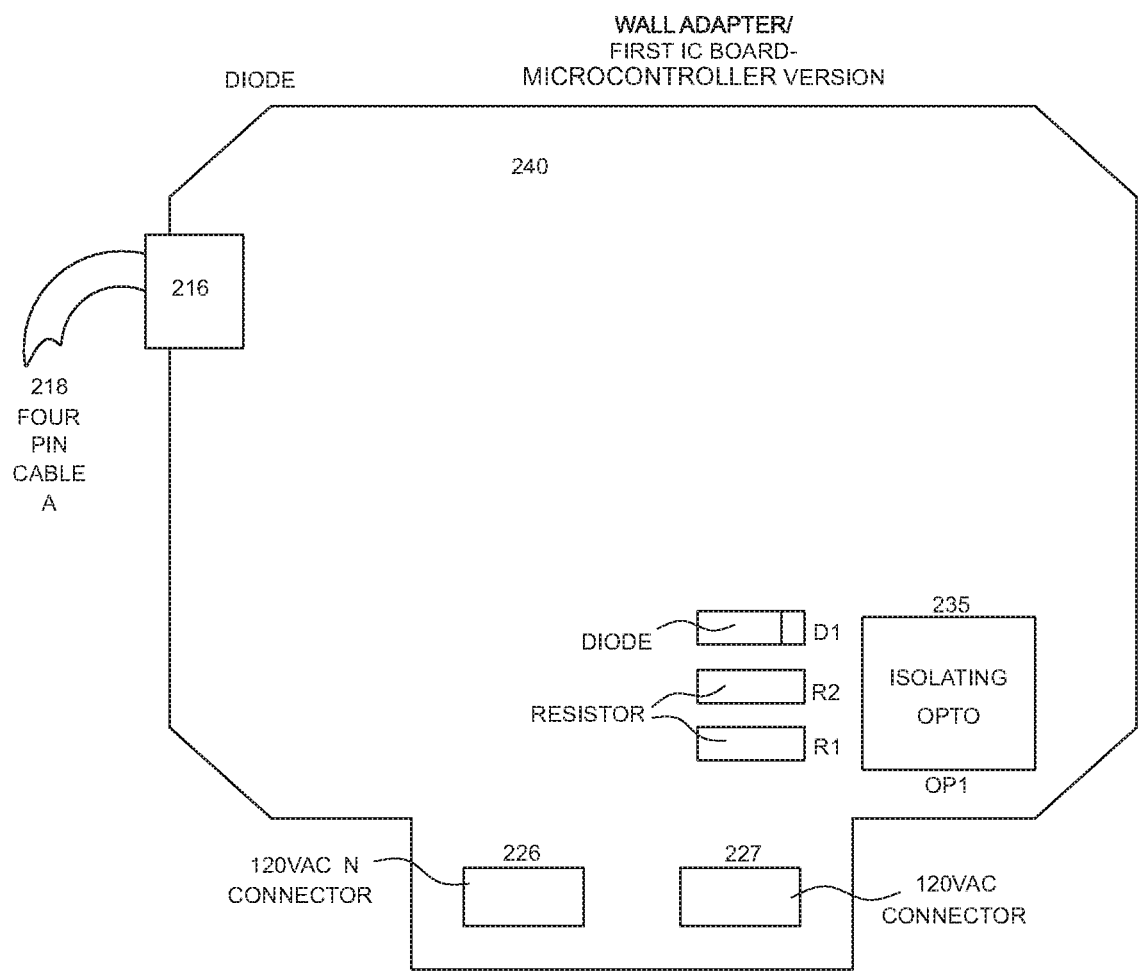
FIG. 2D illustrates a wall adapter IC board of the wall adapter of FIG. 2A according to another embodiment of the disclosure.
Figure 2E:
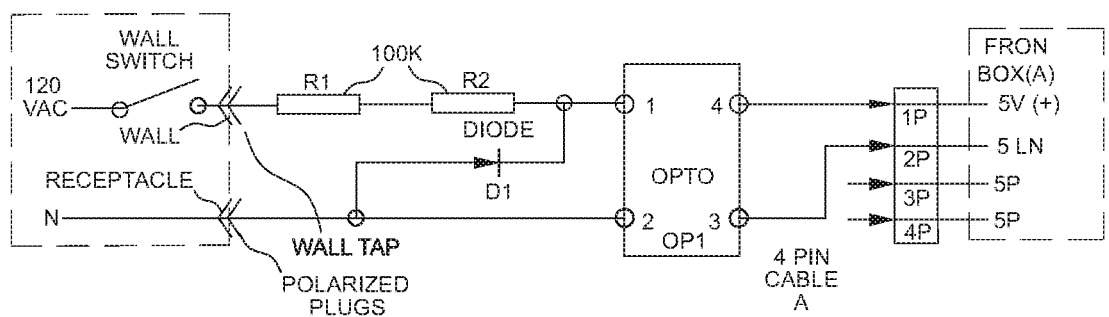
FIG. 2E illustrates an electrical diagram of the wall adapter IC board of FIG. 2D according to an embodiment of the disclosure.

FIG. 2D illustrates another embodiment of the IC board of wall adapter 210. As shown in FIG. 2D, IC board 240 functions using a microcontroller disposed in the first enclosure instead of a diode and flip-flop functionality as in FIG. 2B. That is, IC board 240 comprises an isolating optocoupler 235, a number of resistors R1 and R2, a diode D1, and a multiple pin connector 216 in electrical connection. The IC board 240 is configured to convert a 110 vac latched signal in the wall receptacle to a 5 vdc momentary signal via the isolating optocoupler 235, using the microcontroller as described below in reference to the first enclosure. FIG. 2E illustrates an electrical diagram of the IC board 240 of FIG. 2D, as one of ordinary skill in the art would understand and follow.

Figure 3B:
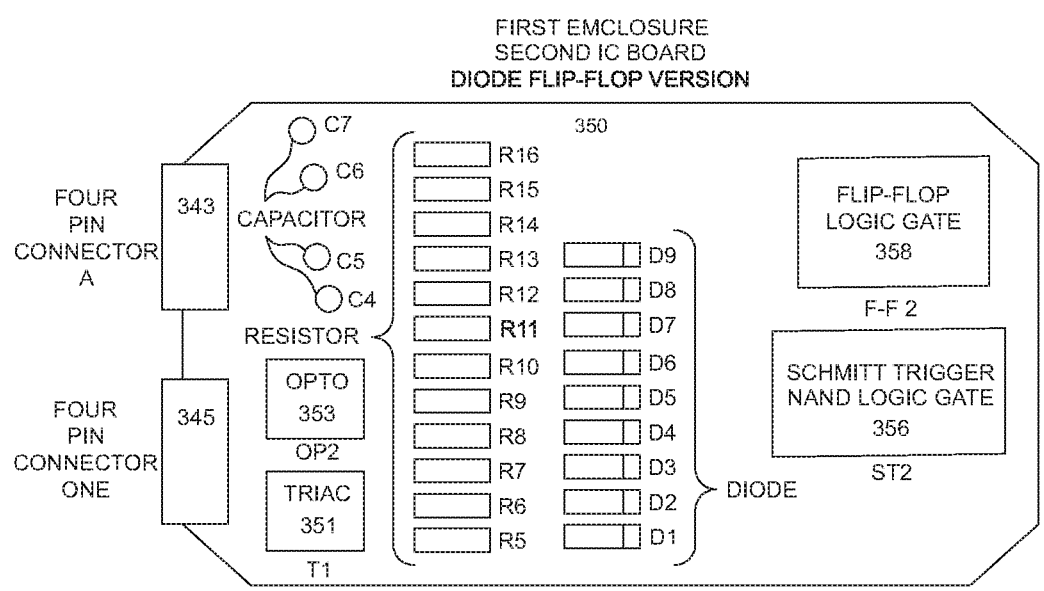
FIG. 3B illustrates a first enclosure IC board of the first enclosure of FIG. 3A according to an embodiment of the disclosure.
Figure 3C:
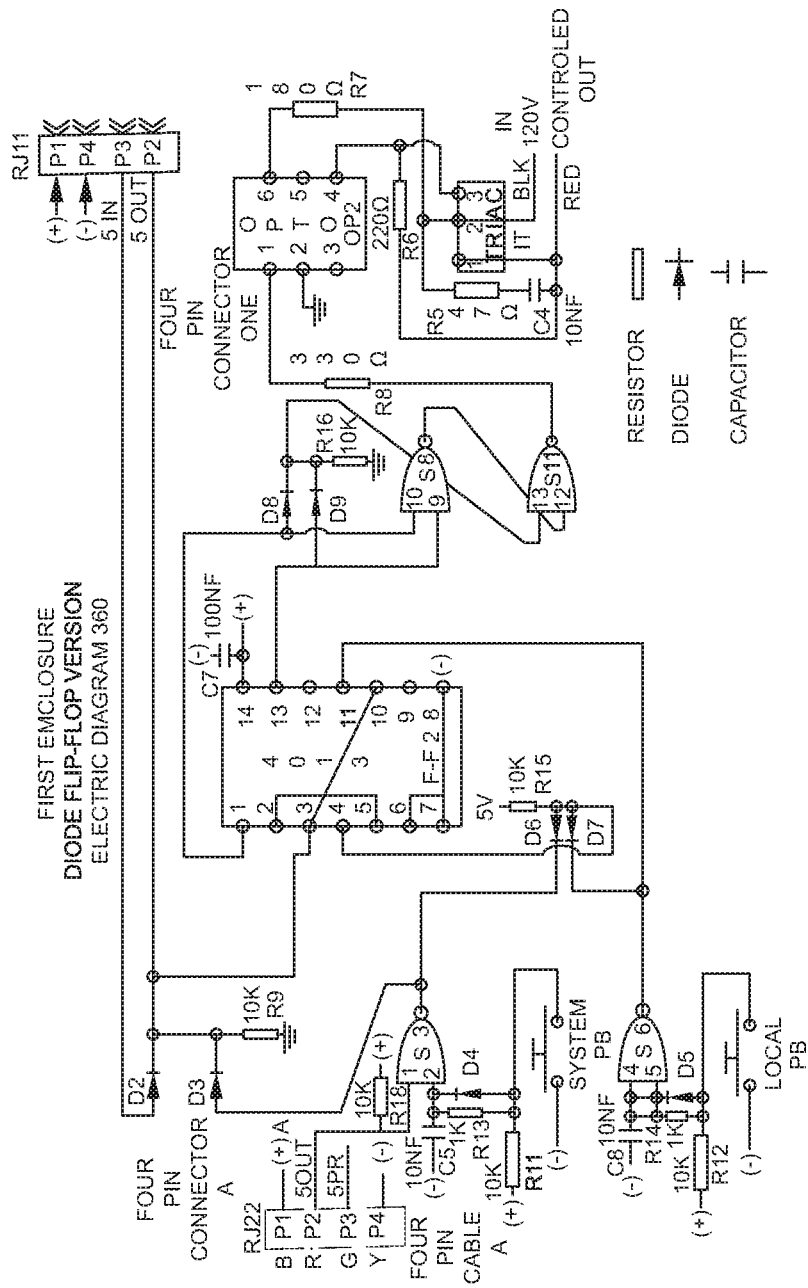
FIG. 3C illustrates an electrical diagram of the first enclosure IC board of FIG. 3B according to an embodiment of the disclosure.

Referring now to FIG. 3B, an embodiment of the first enclosure of FIG. 3A may include an IC board having a diode, flip-flop functionality as described herein. The IC board 350 of FIG. 3B comprises an isolating optocoupler 353 and a TRIAC 351 in electrical connection with the first controlled receptacle 342(a). Additionally, IC board 350 further includes a Flip-Flop logic gate 358, a Schmitt trigger NAND logic gate 356, a number of capacitors C4 thru C7, a number of resistors R5 thru R15, and a number of diodes D2 thru D9 in electrical connection with the isolating optocoupler 353 and TRIAC 351. FIG. 3C illustrates an electrical diagram of the IC board 350 of FIG. 3B, as one of ordinary skill in the art would understand and follow.

Figure 3D:
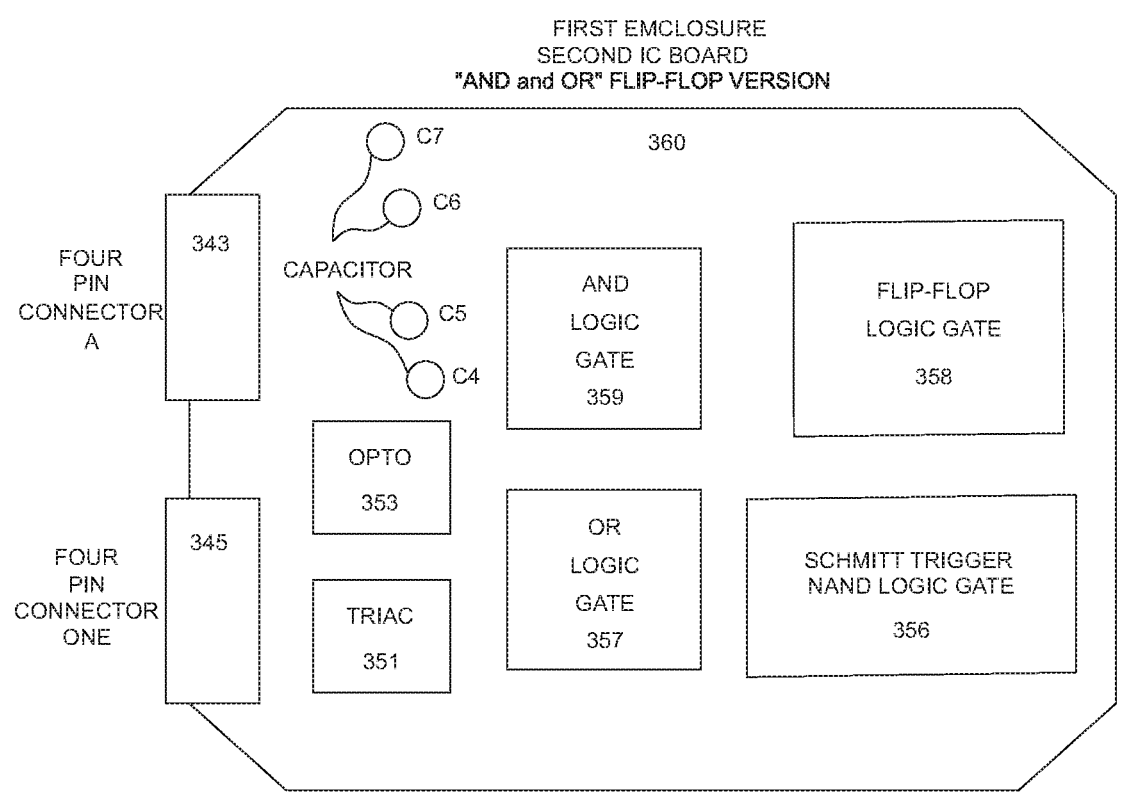
FIG. 3D illustrates a first enclosure IC board of the first enclosure of FIG. 3A according to another embodiment of the disclosure.

FIG. 3D illustrates another embodiment of the IC board of the first enclosure of FIG. 3A which also uses a flip-flop functionality, but without the diodes. IC board 360 of FIG. 3D includes a similar isolating optocoupler 353, TRIAC 351, a number of capacitors C4 thru C7, Flip-Flop logic gate 358, and Schmitt trigger logic gate 356 as in the IC board 350 of FIG. 3B; however, instead of utilizing a number of diodes and resistors, this circuit board includes an AND logic gate 359 and an OR logic gate 357 in electrical connection with the isolating optocoupler 353 and the TRIAC 351.

Figure 3E:
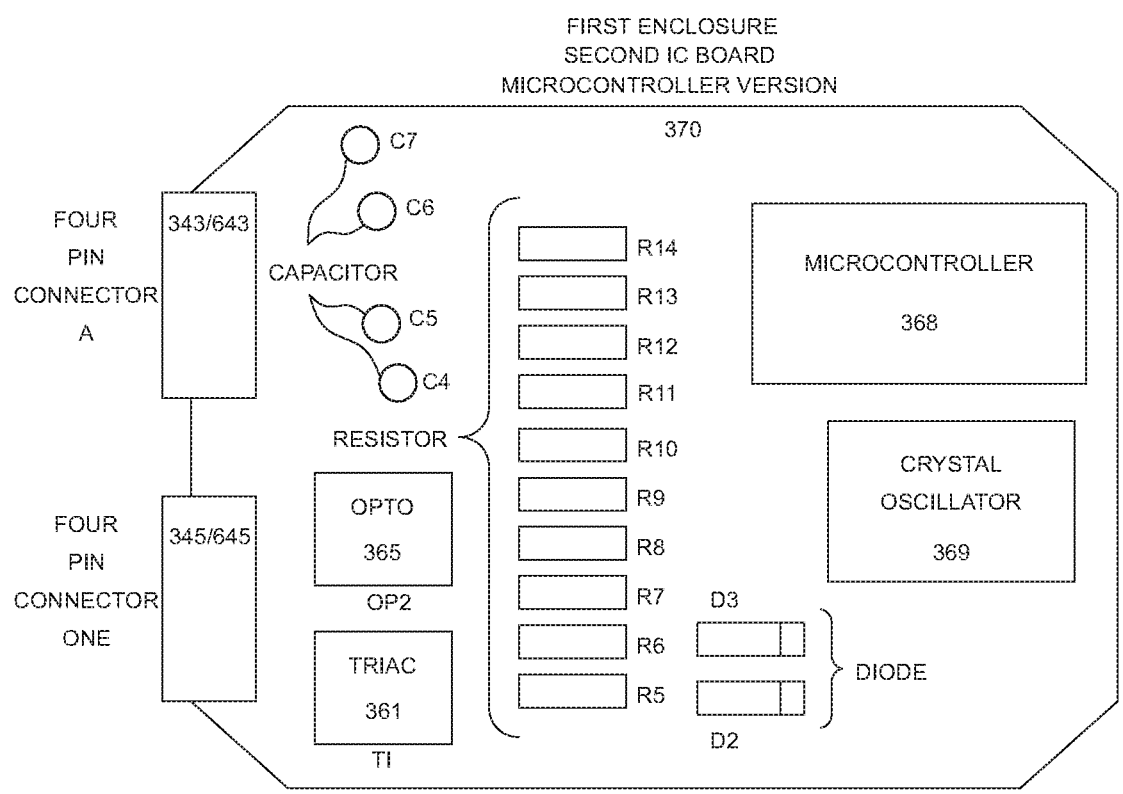
FIG. 3E illustrates a first enclosure IC board of the first enclosure of FIG. 3A according to yet another embodiment of the disclosure.
Figure 3F:
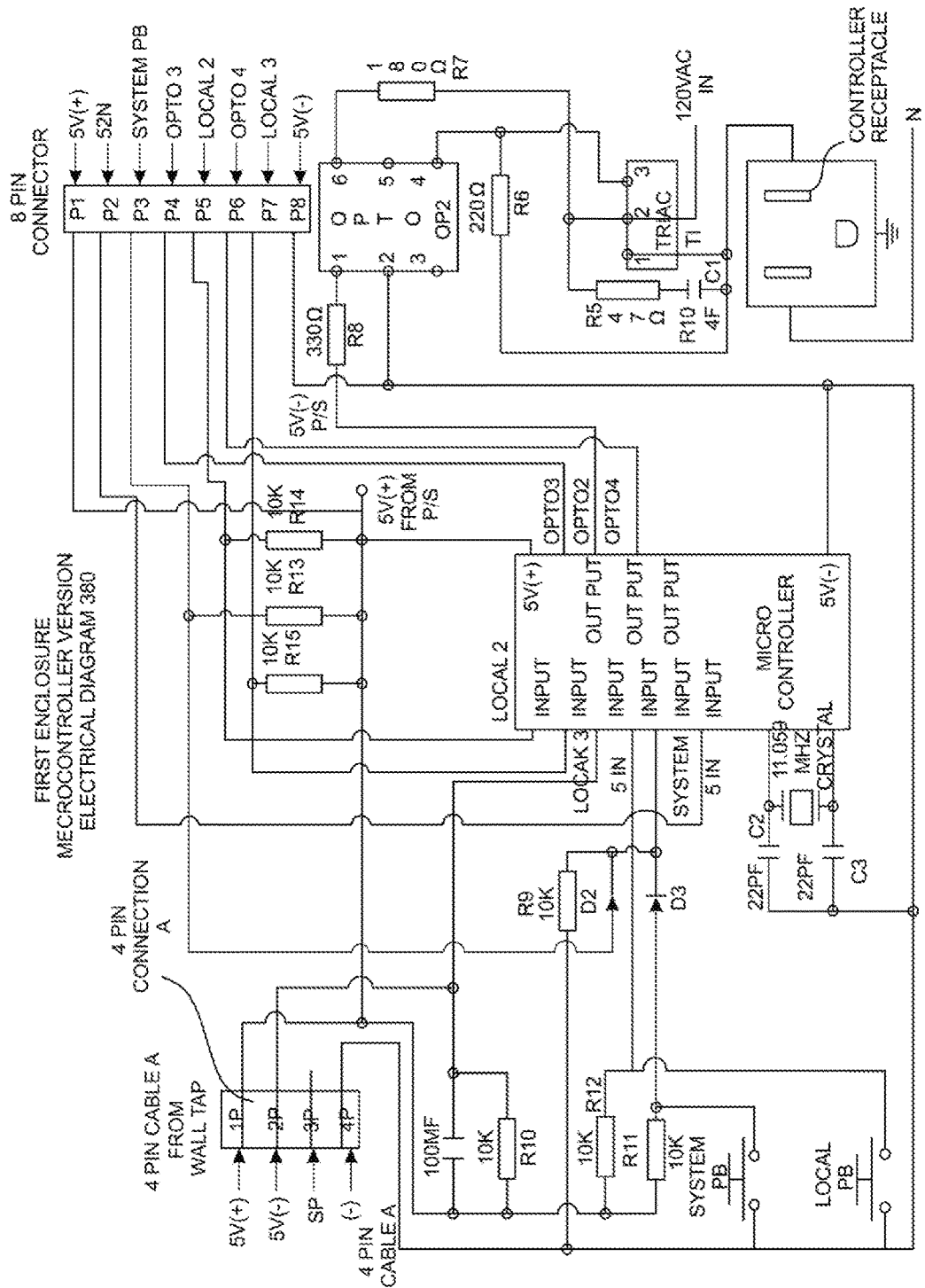
FIG. 3F illustrates an electrical diagram of the first enclosure IC board of FIG. 3E according to an embodiment of the disclosure.

Referring now to FIG. 3E, yet another embodiment of the IC board of the first enclosure of FIG. 3A is illustrated. IC board 370 of FIG. 3E illustrates a microcontroller version of the circuit. In particular, IC board 370 of first enclosure 340 comprises an isolating optocoupler 365 and a TRIAC 361 in electrical connection with the first controlled receptacle 342(a). The IC board 370 further includes a microcontroller 368, a crystal oscillator 369, a number of capacitors C4 thru C7, a number of resistors R5 thru R14, and two diodes D2 and D3. FIG. 3F illustrates an electrical diagram 380 of the IC board 370 of FIG. 3E, as one of ordinary skill in the art would understand and follow.

Figure 4B:
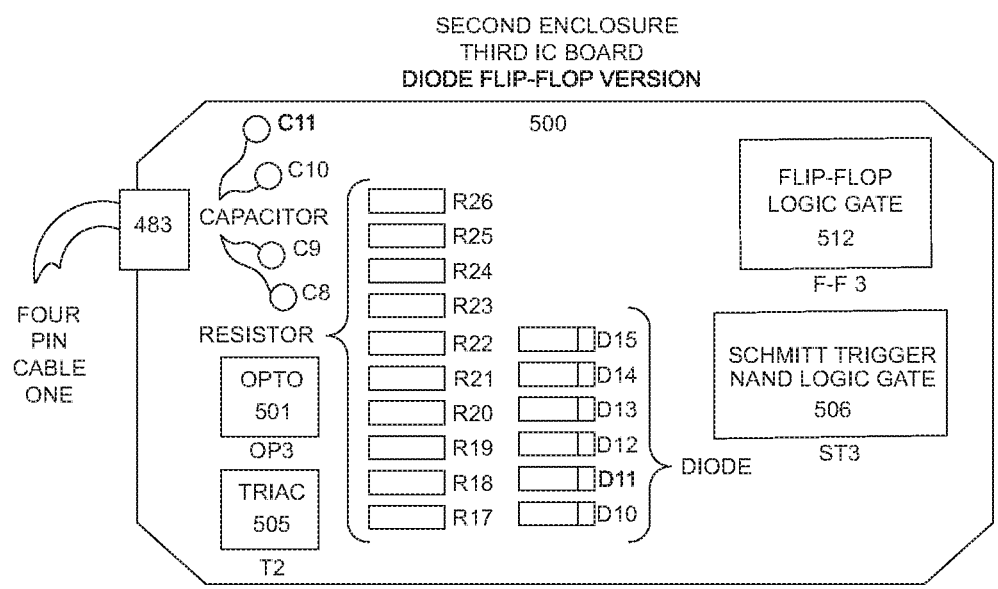
FIG. 4B illustrates a second enclosure IC board of the second enclosure of FIG. 4A according to an embodiment of the disclosure.
Figure 4C:
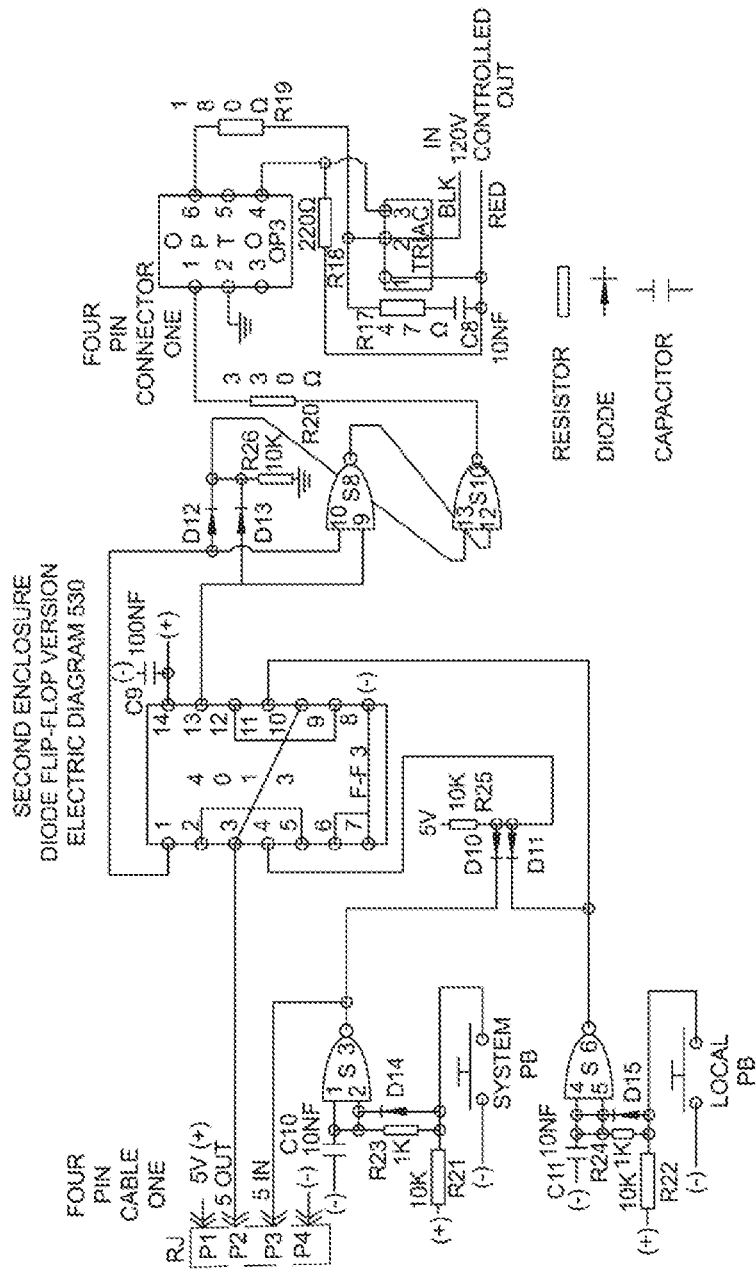
FIG. 4C illustrates an electrical diagram of the second enclosure IC board of FIG. 4B according to an embodiment of the disclosure.

Referring now to FIG. 4B, an embodiment of the second enclosure of FIG. 4A may include an IC board having a diode, flip-flop functionality as described herein. The IC board 500 of FIG. 4B comprises an isolating optocoupler 501 and a TRIAC 505 in electrical connection with the controlled receptacle 482(a). Additionally, IC board 500 further includes a Flip-Flop logic gate 512, a Schmitt trigger NAND logic gate 506, a number of capacitors C8, C9, C10, and C11, a number of resistors R17 thru R26, and a number of diodes D10 thru D15 in electrical connection with the isolating optocoupler 501 and TRIAC 505. FIG. 4C illustrates an electrical diagram 530 of the IC board 500 of FIG. 4B, as one of ordinary skill in the art would understand and follow.

Figure 4D:
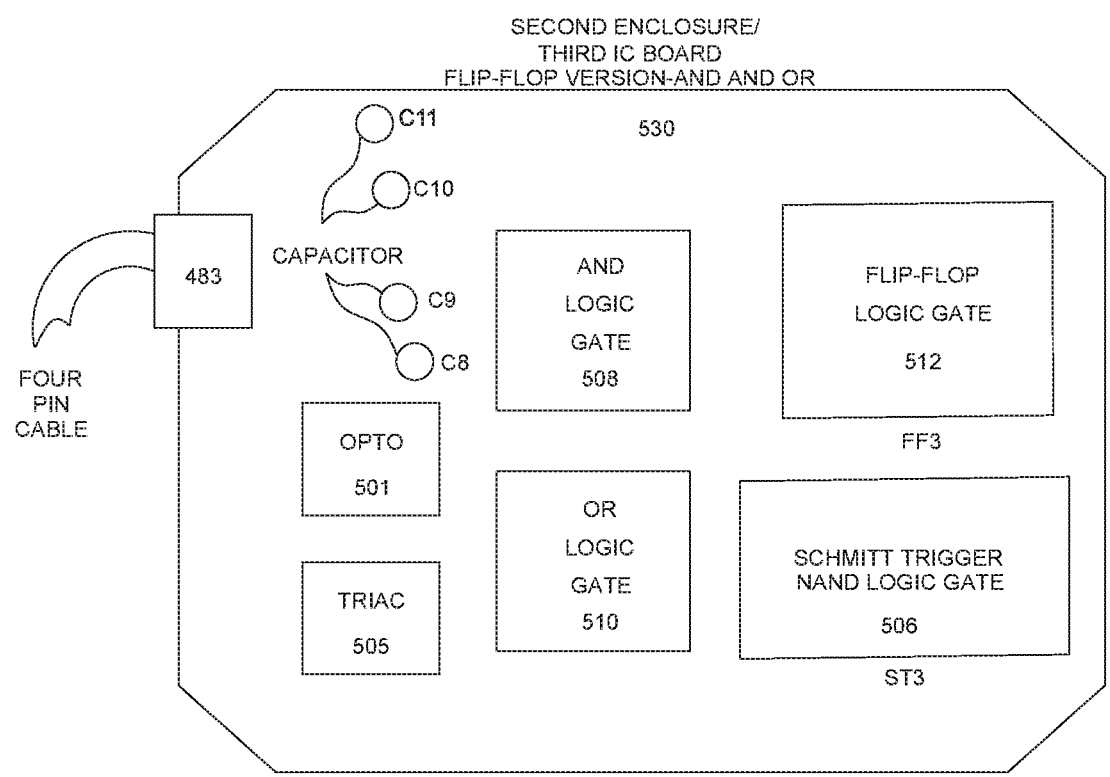
FIG. 4D illustrates a second enclosure IC board of the second enclosure of FIG. 4A according to another embodiment of the disclosure.

FIG. 4D illustrates another embodiment of the IC board of the second enclosure of FIG. 4A which uses a flip-flop functionality, but without the diodes. IC board 530 of FIG. 4D includes a similar isolating optocoupler 501, TRIAC 505, Flip-Flop logic gate 512, and Schmitt trigger logic gate 506 as in the IC board 500 of FIG. 4B; however, instead of utilizing a number of diodes and resistors, this circuit board includes an AND logic gate 508 and an OR logic gate 510 in electrical connection with the isolating optocoupler 501 and the TRIAC 505. IC board 530 further includes a number of capacitors C8, C9, C10, and C11. As one of ordinary skill in the art would understand, the number of capacitors C8 thru C11 on the IC boards of FIGS. 4B and 4D function is a same way. That is, C8 is part of a snubber circuit which serves to protect the TRIAC and optocoupler from high inductive loads. C9 is a recommended decoupling capacitor for the logic gates; and C10 and C11 are part of a Debounce circuit associated with the push buttons. Generally speaking, as those of ordinary skill in the art understand, the capacitors of the disclosed embodiments store unwanted or unexpected energy and dissipate it slowly, smoothing unexpected energy spikes.

Figure 4E:
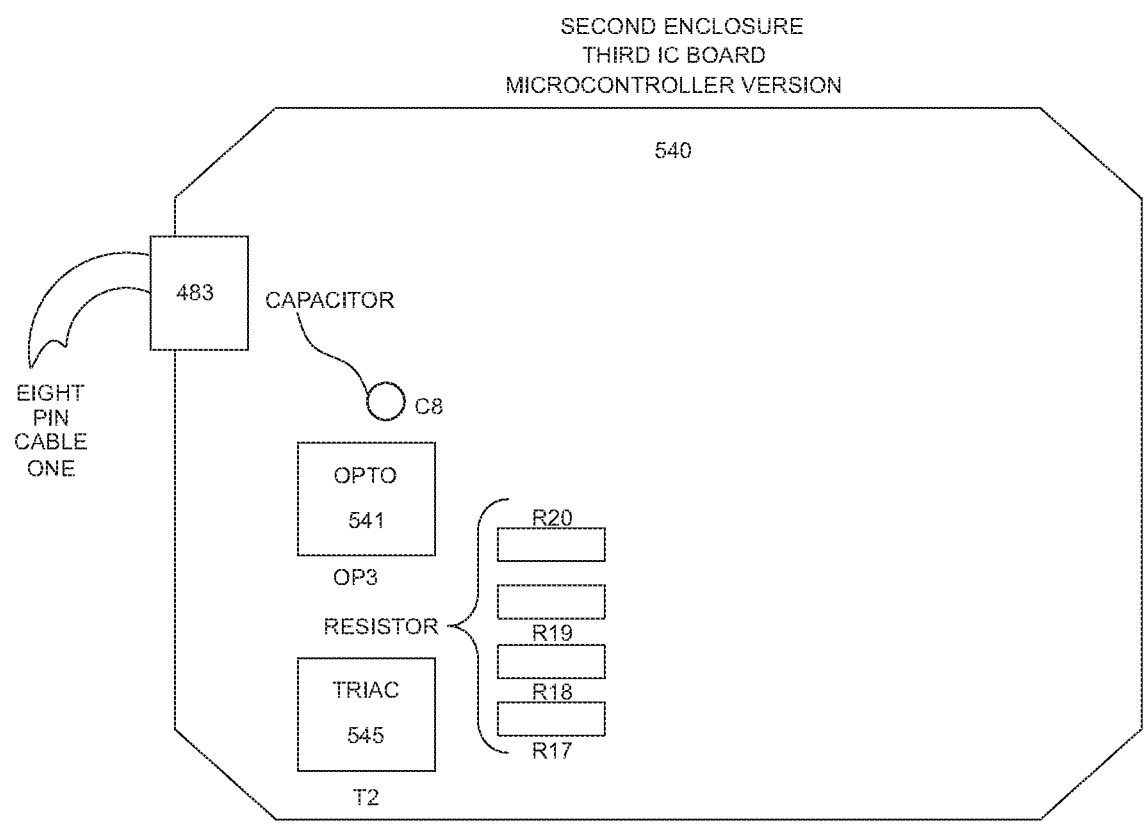
FIG. 4E illustrates a second enclosure IC board of the second enclosure of FIG. 4A according to yet another embodiment of the disclosure.
Figure 4F:
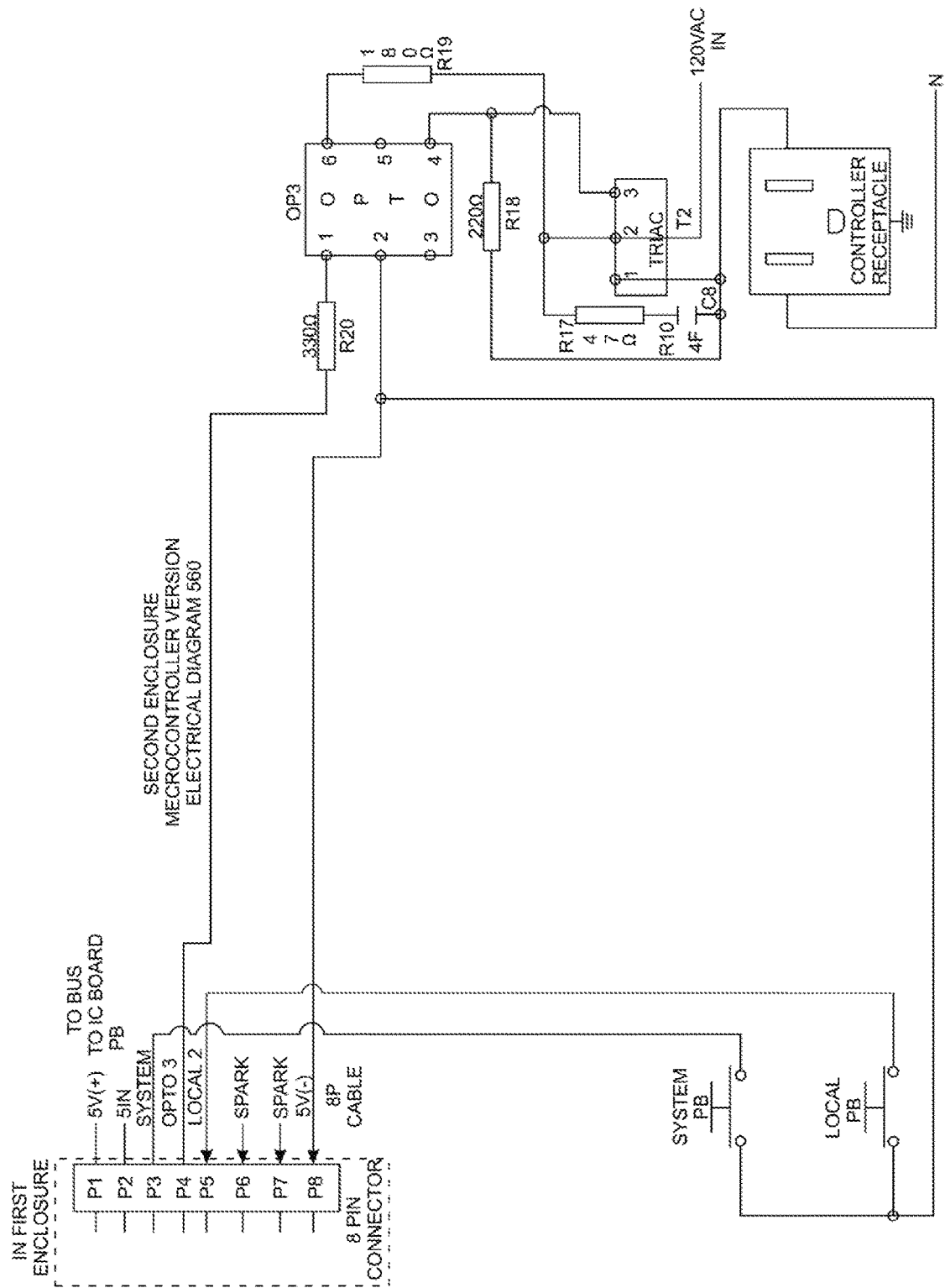
FIG. 4F illustrates an electrical diagram of the second enclosure IC board of FIG. 4E according to an embodiment of the disclosure.

Referring now to FIG. 4E, yet another embodiment of the IC board of the second enclosure of FIG. 4A is illustrated. IC board 540 of FIG. 4E illustrates a microcontroller version of the circuit. In particular, IC board 540 of second enclosure 480 comprises an isolating optocoupler 541 and a TRIAC 545 in electrical connection with the first controlled receptacle 482(a). The IC board 540 further includes a capacitor C8, and a number of resistors R17 thru R20. FIG. 4F illustrates an electrical diagram 560 of the IC board 540 of FIG. 4E, as one of ordinary skill in the art would understand and follow.

Figure 5:
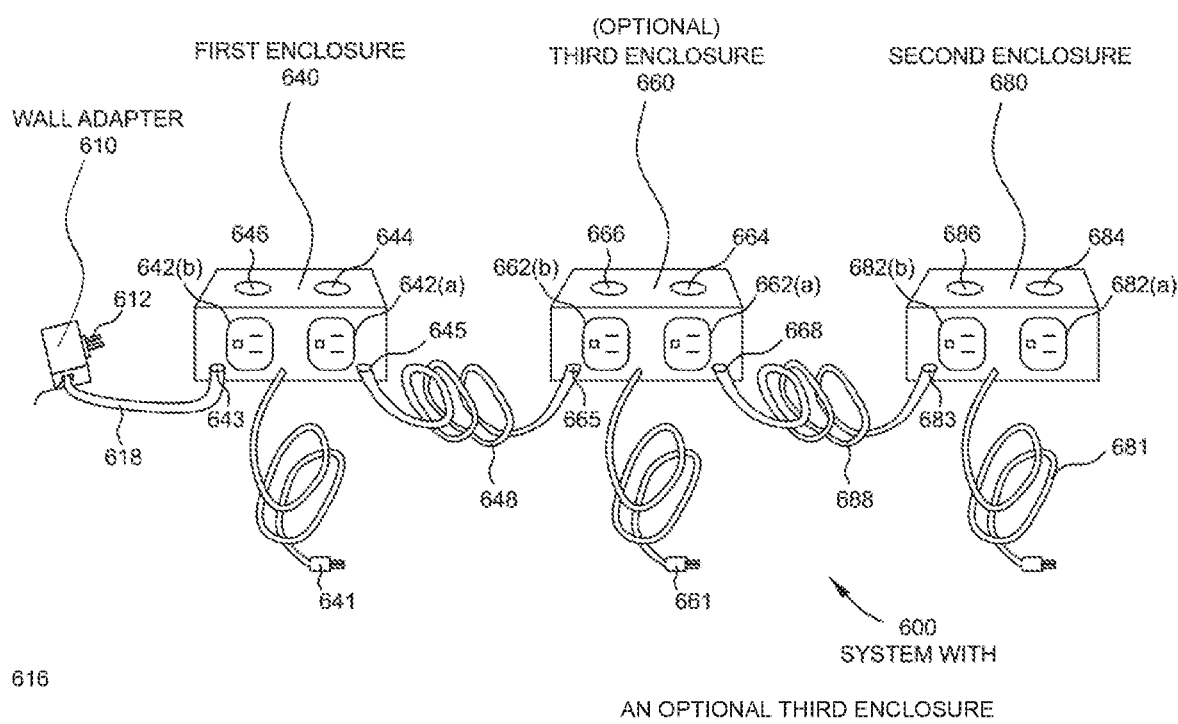
FIG. 5 illustrates a perspective view of an electrical control system with an optional third enclosure according to an embodiment of the disclosure.

FIG. 5 illustrates an electrical control system 600 that is similar to that of electrical control system 100 in FIG. 1, but which further includes a third enclosure 660 electrically connected to the system between the first enclosure 640 and the second enclosure 680. As shown in FIG. 5, wall adapter 610 is connected to the first enclosure 640 via multiple pin cable 618. The first enclosure 640 and also attached to the third enclosure 660 via multiple pin cable 648 which connects to the first enclosure 640 at multiple pin connector 645 and to the third enclosure at multiple pin connector 665. The third enclosure 660 is additionally attached to the second enclosure 680 via multiple pin cable 688 at multiple pin connectors 668 and 683, respectively. The third enclosure 660 further includes an uncontrolled receptacle 662(b) and a controlled receptacle 662(a), a push button 664, a synchronizing push button 666, and an IC board (as illustrated in FIG. 6A, FIG. 6C, and FIG. 6D).

Figure 6A:
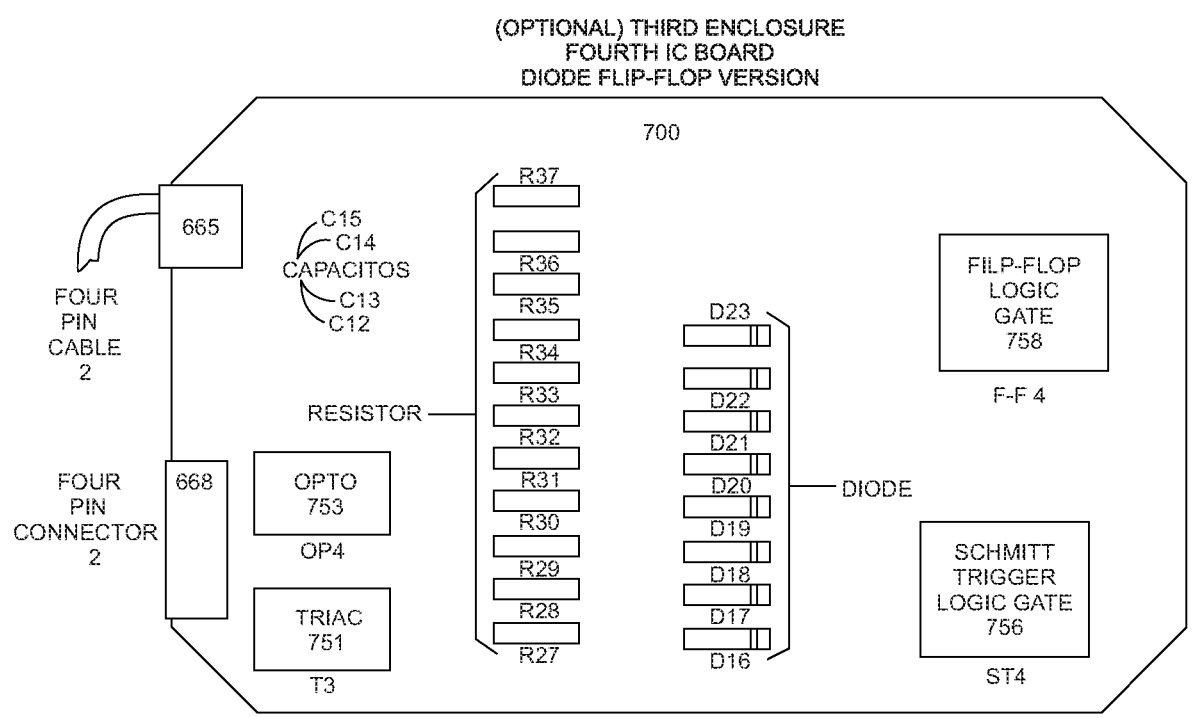
FIG. 6A illustrates a third enclosure IC board of the third enclosure of FIG. 5 according to an embodiment of the disclosure.
Figure 6B:
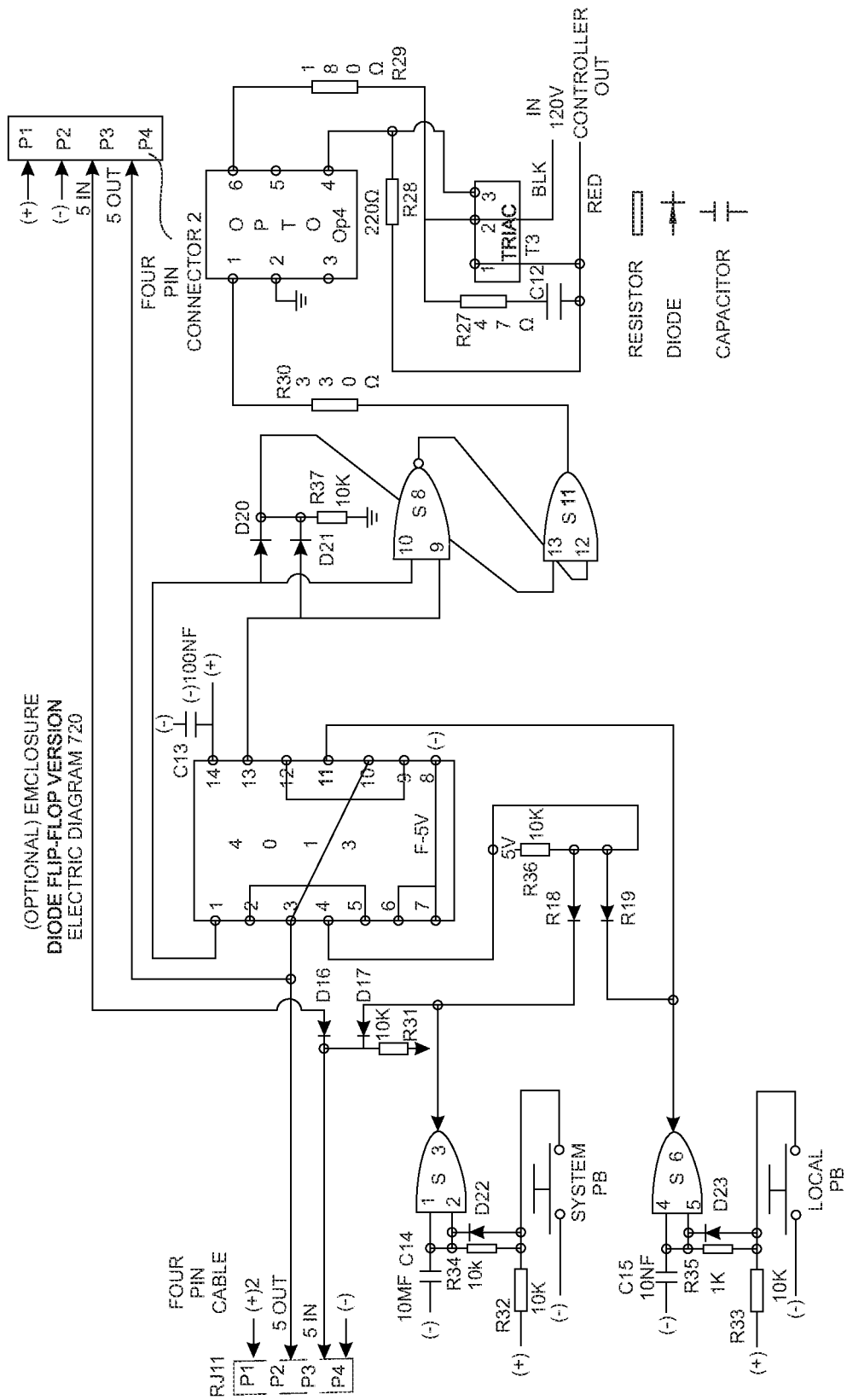
FIG. 6B illustrates an electrical diagram of the third enclosure IC board of the third enclosure of FIG. 6A according to an embodiment of the disclosure.

Referring to FIG. 6A, the third enclosure 660 of FIG. 5 may include an IC board having a diode, flip-flop functionality as described herein. The IC board 700 of FIG. 6A comprises an isolating optocoupler 753 and a TRIAC 751 in electrical connection with the controlled receptacle 662(a). Additionally, IC board 700 further includes a Flip-Flop logic gate 758, a Schmitt trigger NAND logic gate 756, a number of capacitors C12, C13, C14, and C15, a number of resistors R27 thru R37, and a number of diodes D16 thru D23 in electrical connection with the isolating optocoupler 753 and TRIAC 751. FIG. 6B illustrates an electrical diagram 720 of the IC board 700 of FIG. 6A, as one of ordinary skill in the art would understand and follow.

Figure 6C:
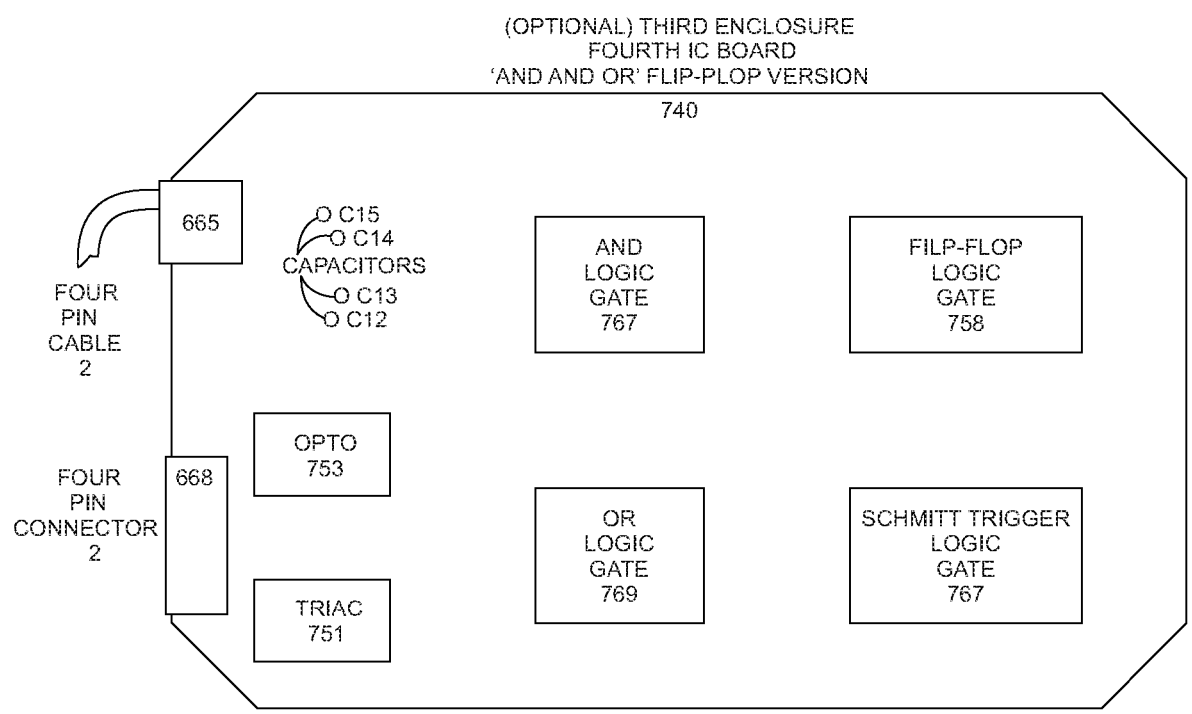
FIG. 6C illustrates a third enclosure IC board of the third enclosure of FIG. 5 according to another embodiment of the disclosure.

FIG. 6C illustrates another embodiment of the IC board of the third enclosure 660 of FIG. 5 which also uses a flip-flop functionality, but without the diodes. IC board 740 of FIG. 6C includes a similar isolating optocoupler 753, TRIAC 751, Flip-Flop logic gate 758, and Schmitt trigger logic gate 756 as in the IC board 700 of FIG. 6A; however, instead of utilizing a number of diodes and resistors, this circuit board includes an AND logic gate 767 and an OR logic gate 769 in electrical connection with the isolating optocoupler 753 and the TRIAC 751.

Figure 6D:
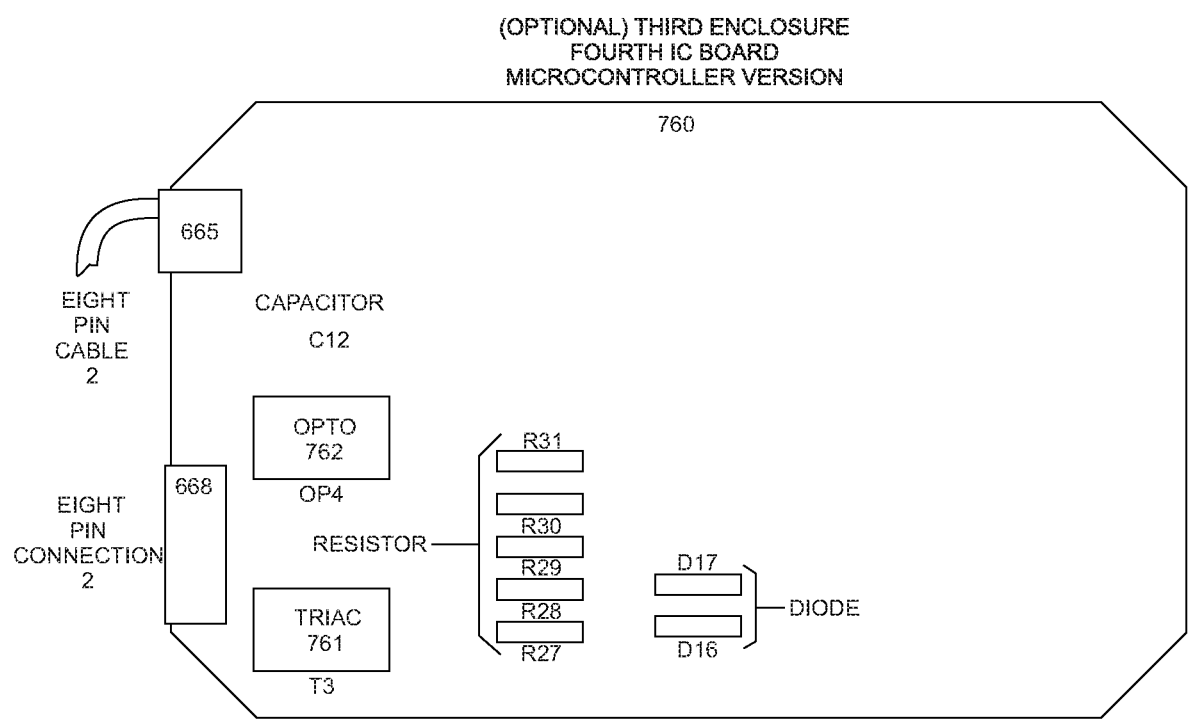
FIG. 6D illustrates a third enclosure IC board of the third enclosure of FIG. 5 according to yet another embodiment of the disclosure.
Figure 6E:
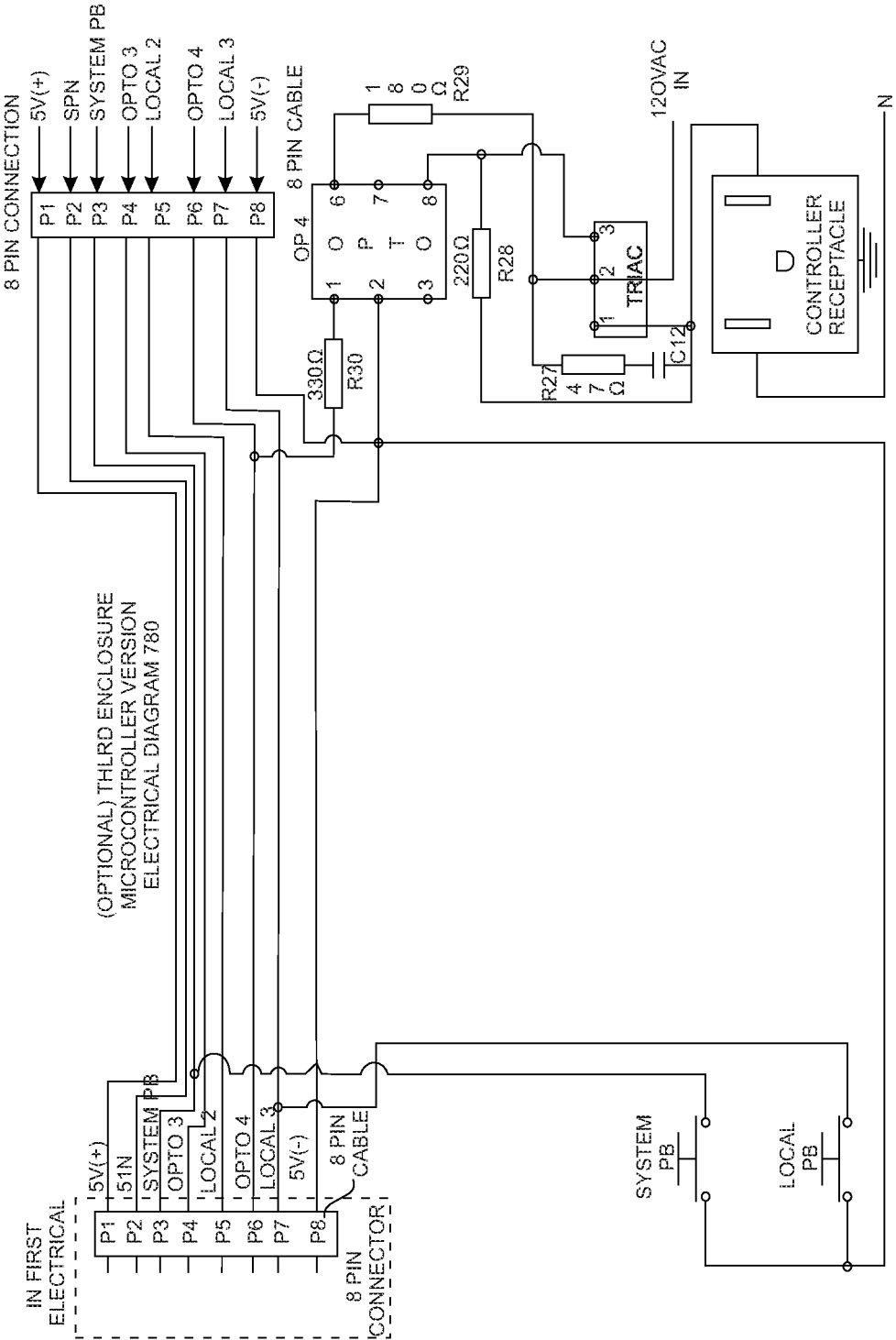
FIG. 6E illustrates an electrical diagram of the third enclosure IC board of the third enclosure of FIG. 6D according to an embodiment of the disclosure.

Referring now to FIG. 6D, yet another embodiment of the IC board of the third enclosure 660 of FIG. 5 is illustrated. IC board 760 of FIG. 6D illustrates a microcontroller version of the circuit. In particular, IC board 760 of third enclosure 660 comprises an isolating optocoupler 762 and a TRIAC 761 in electrical connection with the controlled receptacle 662(a). The IC board 760 further includes a capacitor C12, a number of resistors R27 thru R31, and two diodes D16 and D17. FIG. 6E illustrates an electrical diagram 780 of the IC board 760 of FIG. 6D, as one of ordinary skill in the art would understand and follow.

The following few paragraphs describe the various multiple-pin connectors and cables of embodiments of the disclosure that include a use of a microcontroller, for example, as shown in FIGS. 2D, 2E, 3E, 3F, 4E, 4F, 6D, and 6E.

In an embodiment, the wall adapter utilizes the only four-pin connector in the electrical control system. The four-pin connector of the wall adapter includes pins P1 thru P4 as included in the electrical diagrams of the embodiments utilizing a microcontroller. A first pin P1 is connected to 5v(+) bus on the first IC board, a second pin P2 is connected to first optocoupler on first IC board and is labeled "SIN" (signal in), a third pin P3 is not used in the wall adapter, a fourth pin P4 is connected to first optocoupler 5v(−) on first IC board in the wall adapter.

In an embodiment, the eight-pin connector of the first enclosure includes pins P1 thru P8 as included in the electrical diagrams of the embodiments utilizing a microcontroller. A first pin P1 is connected to the 5v(+) power supply and the microcontroller on the second IC board of the first enclosure, a second pin P2 is connected to SIN P2 from the wall adapter and to the microcontroller, a third pin P3 is connected to the system push button and the microcontroller, a fourth pin P4 is connected to the microcontroller in first enclosure, a fifth pin P5 is connected to the microcontroller, a sixth pin P6 is connected to the microcontroller, a seventh pin P7 is connected to the microcontroller, and an eight pin P8 is connected to the 5v(−) power supply and microcontroller on the second IC board in the first enclosure.

In an embodiment, the eight-pin pin cable of the second enclosure includes pins P1 thru P8 as included in the electrical diagrams of the embodiments utilizing a microcontroller. A first pin P1 is connected to 5v(+) bus on the third IC board of the second enclosure, a second pin P2 is connected to SIN from the wall adapter and to third IC board, a third pin P3 is connected to the system push button in second enclosure, a fourth pin P4 is connected to third optocoupler on third IC board, a fifth pin P5 is connected to local 2 push button in the second enclosure, a sixth pin P6 is not used in second enclosure, a seventh pin P7 is not used in second enclosure, and an eight pin P8 is connected to the 5v(−) bus on the third IC board in the second enclosure.

In an embodiment, the eight-pin connector of the third enclosure includes pins P1 thru P8 as included in the electrical diagrams of the embodiments utilizing a microcontroller. A first pin P1 is connected to 5v(+) bus on the fourth IC board of the third enclosure, a second pin P2 is connected to pin 2 of eight-pin cable in third enclosure, a third pin P3 is connected to the system push button in third enclosure, a fourth pin P4 is connected to pin 4 of eight-pin cable in third enclosure, a fifth pin P5 is connected to pin 5 of eight-pin cable in third enclosure, a sixth pin P6 is connected to the fourth optocoupler on the fourth IC board, a seventh pin P7 is connected to local 3 push button in third enclosure, and an eight pin P8 is connected to the 5v(−) bus on fourth IC board in the third enclosure.

In an embodiment, the eight-pin cable of the third enclosure includes pins P1 thru P8 as included in the electrical diagrams of the embodiments utilizing a microcontroller. A first pin P1 is connected to 5v(+) bus on the fourth IC board of the third enclosure, a second pin P2 is connected to pin 2 of eight-pin cable in third enclosure, a third pin P3 is connected to the system push button in third enclosure, a fourth pin P4 is connected to pin 4 of eight-pin connector in third enclosure, a fifth pin P5 is connected to pin 5 of eight-pin connector in third enclosure, a sixth pin P6 is connected to the fourth optocoupler on the fourth IC board, a seventh pin P7 is connected to local 3 push button in third enclosure, and an eight pin P8 is connected to the 5v(−) bus on fourth IC board in the third enclosure.

In various embodiments of the disclosure, additional resistors could be added to the electrical control system to move a 220 Volt (European standard) to a 110 vac or 5 vdc power supply.

In various embodiments of the disclosure, the multiple-pin cables and multiple-pin connectors can be removed and replaced with a wireless system to enable the disclosed electrical control systems to be controlled wirelessly.

Embodiments of the instant disclosure utilizing integrated circuits incorporating a FLIP-FLOP functionality as illustrated in one or more of FIGS. 2A thru 2C, FIGS. 3A thru 3D, FIGS. 4A thru 4D, and FIGS. 6A thru 6C are included below as various Embodiments "A."

Embodiments A

In an Embodiment A1, an electrical control system (100) configured to control an electrical device from two or more locations with independent control function, the electrical control system comprising: a wall adapter (110/210) and a first enclosure (140/340). The wall adapter (110/210) comprising a first set of polarized male plugs (112/212) and a first integrated circuit (IC) board (220); wherein the first set of polarized male plugs (112/212) is configured to provide electrical connection with a wall receptacle controlled by a single-pole wall switch; wherein the first IC board (220) comprises a first isolating optocoupler (225), a first dual FLIP-FLOP logic gate (221), a first quad NAND SCHMITT trigger logic gate (222), a pulse generator (223), and a first multiple pin connector (216) in electrical connection; and wherein the first IC board (220) is configured to convert a 110 vac latched signal in the wall receptacle to a 5 vdc momentary signal via the first isolating optocoupler (225). The first enclosure (140/340) of Embodiment A1 comprising a first push button (144/344) in electrical connection with the wall adapter (110/210), a first 110 vac power cord (141/341), a first 5 vdc power supply, a first uncontrolled receptacle (142(b)/342(b)), a first controlled receptacle (142(a)/342(a)), a first multiple pin cable (118/318), a second multiple pin connector (143/343), and a second IC board (350); wherein the first multiple pin cable (118/318) is configured to electrically connect the first enclosure (140/340) at the second multiple pin connector (143/343) to the wall adapter (110/210) via the first multiple pin connector (116/216); wherein the second IC board (350) comprises a second isolating optocoupler (353) and a first TRIAC (351) in electrical connection with the first controlled receptacle (142(a)/341(a)); wherein the first 110 vac power cord (141/341) is connected at a first end to an uncontrolled power source and at a second end to the first 5 vdc power supply via the first uncontrolled receptacle (142(b)/342(b)), and wherein the second IC board (350) is connected to the first 5 vdc power supply and is configured to allow the first push button (144/344) of the first enclosure (140/340) and the wall switch via the wall adapter (110/210) to control the second isolating optocoupler (353) and the first TRIAC (351) to turn the electrical control system (100) on and off.

In an Embodiment A2, the electrical control system of Embodiment A1, wherein the wall adapter further comprises a second set of polarized male plugs (not shown) and is configured to connect with an uncontrolled side of a half/split circuit wall receptacle.

In an Embodiment A3, the electrical control system of Embodiment A2, wherein the wall adapter further comprises a LED night light (not shown) electrically connected to a photo sensor (not shown).

In an Embodiment A4, the electrical control system of Embodiment A1, wherein the second IC board (360) further comprises a second dual FLIP-FLOP logic gate (358), a second quad NAND Schmitt trigger logic gate (356), a first OR logic gate (357), and a first AND logic gate (359) in electrical connection with the second isolating optocoupler (353) and the first TRIAC (351).

In an Embodiment A5, the electrical control system of Embodiment A4, further comprising a second enclosure (180/480), wherein the second enclosure (180/480) comprises a second push button (184/484), a second 110 vac power cord (181/481), a second multiple pin cable (148/448), a second uncontrolled receptacle (182(b)/482(b)), and a second controlled receptacle (182(a)/482(a)) in electrical connection with a third IC board (500); wherein the second multiple pin cable (148/448) is configured to electrically connect the first enclosure (140/340) at a third multiple pin connector (145/345) to the second enclosure (180/480) via the fourth multiple pin connector (183/483); and also wherein the third IC board (500) of the second enclosure and the second IC board (350) of the first enclosure (140/340) and the wall switch via the wall adapter (110/210) are configured to control the second isolating optocoupler (353) and the third isolating optocoupler (501) and the first TRIAC (351) and second TRIAC (505) that are connected to the first (142(a)/342(a)) and second controlled receptacles (182(a)/482(a)) in respective first (140/340) and second (180/480) enclosures in order to turn them on and off.

In an Embodiment A6, the electrical control system of Embodiment A1, wherein the second IC board (350) further comprises a second dual FLIP-FLOP logic gate (358), a second quad NAND SCHMITT trigger logic gate (356), multiple resistors (R5 thru R16), and multiple diodes (D2 thru D9) in electrical connection with the second isolating optocoupler (353) and the first TRIAC (351).

In an Embodiment A7, the electrical control system of Embodiment A6, further comprising a second enclosure (180/480), wherein the second enclosure (180/480) comprises a second push button (184/484), a second 110 vac power cord (181/481), a second multiple pin cable (148/448), a second uncontrolled receptacle (182(b)/482(b)), and a second controlled receptacle (182(a)/482(a)) in electrical connection with a third IC board (500); wherein the third IC board (500) comprises a third dual FLIP-FLOP logic gate (512), a second AND logic gate (508), a second OR logic gate (510), a third quad NAND SCHMITT trigger logic gate (506), a third isolating optocoupler (501), and a second TRIAC (505) in electrical connection; wherein the second multiple pin cable (148/448) is configured to electrically connect the first enclosure (140/340) at a third multiple pin connector (145/345) to the second enclosure (180/480) via the fourth multiple pin connector (183/483); and wherein the third IC board (500) of the second enclosure and the second IC board (350) of the first enclosure (140/340) and the wall switch via the wall adapter (110/210) are configured to control the second isolating optocoupler (353) and the third isolating optocoupler (501) and the first TRIAC (351) and second TRIAC (505) that are connected to the first (142(a)/342(a)) and second controlled receptacles (182(a)/482(a)) in respective first (140/340) and second (180/480) enclosures in order to turn them on and off.

In an Embodiment A8, the electrical control system of Embodiment A1, further comprising a second enclosure (180/480), wherein the second enclosure (180/480) comprises a second push button (184/484) in electrical connection with the first enclosure (140/340).

In an embodiment A9, the electrical control system of Embodiment A1, wherein the wall adapter (110/210) further comprises at least one uncontrolled USB charging port (not shown).

In an embodiment A10, the electrical control system of Embodiment A1, wherein the first enclosure (140/340) further comprises at least one uncontrolled USB charging port (not shown).

In an embodiment A11, the electrical control system of Embodiment A7, wherein the second enclosure (180/480) further comprises at least one uncontrolled USB charging port (not shown).

In an Embodiment A12, an electrical control system (100) configured to control an electrical device from two or more locations, the electrical control system comprising a wall adapter (110/210), a first enclosure (140/340), and a second enclosure (180/480). The wall adapter (110/210) comprising a first set of polarized male plugs (112/212) and a first integrated circuit (IC) board (220), wherein the first set of polarized male plugs (112/212) is configured to provide electrical connection with a wall receptacle controlled by a single-pole wall switch; wherein the first IC board (220) comprises a first dual FLIP-FLOP logic gate (221), a first quad NAND SCHMITT trigger logic gate (222), a first isolating optocoupler (225), a pulse generator (223), and a first multiple pin connector (216) in electrical connection; and wherein the first IC board (220) is configured to convert a 110 vac latched signal to a 5 vdc momentary signal via the first isolating optocoupler (225). The first enclosure (140/340) comprising a first push button (144/344) in electrical connection with the wall adapter (110/210) and configured to provide a 5 vdc momentary signal from a 110 vac wall switch in electrical connection with the first enclosure (140/340); wherein the first enclosure (140/340) further comprises a first 110 vac power cord (141/341), a first multiple pin cable (118/318), a second multiple pin connector (143/343), a third multiple pin connector (145/345), a first uncontrolled receptacle (142(b)/342(b)), and a first controlled receptacle (142(a)/342(a)) in electrical connection with a second IC board (350); wherein the second IC board (350) comprises a second dual FLIP-FLOP logic gate (358), a second quad NAND SCHMITT trigger logic gate (356), and at least one of a first OR logic gate (357) and a first AND logic gate (359), or multiple resistors (R5 thru R16) and multiple diodes (D2 thru D9), in electrical connection with a second isolating octocoupler (353) and a first TRIAC (351); and wherein the first multiple pin cable (118/318) is configured to connect the first IC board (220) at the first multiple pin connector (216) to the second IC board (350) and its first 5 vdc power supply at the second multiple pin connector (343). The second enclosure (180/480) comprising a second push button (184/484), a second 110 vac power cord (181/481), a second multiple pin cable (148/448), a second uncontrolled receptacle (182(b)/482(b)), and a second controlled receptacle (182(a)/482(a)) in electrical connection with a third IC board (500); wherein the third IC board (500) comprises a third dual FLIP-FLOP logic gate (512), a third quad NAND SCHMITT trigger logic gate (506), and at least one of a second OR logic gate (510) and a second AND logic gate (508), or multiple resistors (R17 thru R26) and multiple diodes (D10 thru D15), in electrical connection with a third isolating optocoupler (501) and a second TRIAC (505); and wherein the second multiple pin cable (148/448) is configured to electrically connect the second IC board (350) at the third multiple pin connector (145/345) to the third IC board (500) via the fourth multiple pin connector (483); and wherein the electrical connection between the first IC board (220), the second IC board (350), and the third IC board (500) is configured to allow the wall switch via the wall adapter (110/210), the first push button (144/344) of the first enclosure (140/340), and the second push button (184/484) of the second enclosure (180/480) to turn the first (142(a)/342(a)) and second controlled receptacles (182(a)/482(a)) on and off.

An Embodiment A13, wherein the wall adapter (110/210) of the electrical control system of Embodiment A12 further comprises a second set of polarized male plugs (not shown) configured to connect with an uncontrolled side of a half/split circuit wall receptacle.

An Embodiment A14, wherein the wall adapter (110/210) of the electrical control system of Embodiment A13 further comprises a LED night light (not shown) electrically connected to a photo sensor (not shown).

An Embodiment A15, wherein the wherein the wall adapter (110/210) of the electrical control system of Embodiment A12 further comprises at least one uncontrolled USB charging port (not shown).

An Embodiment A16, wherein the first enclosure (140/340) of the electrical control system of Embodiment A12 further comprises at least one uncontrolled USB charging port (not shown).

An Embodiment A17, wherein the second enclosure (180/480) of the electrical control system of Embodiment A12 further comprises at least one uncontrolled USB charging port (not shown).

An Embodiment A18, wherein the first enclosure (140/340) of the electrical control system of Embodiment 5A further comprises a first synchronizing push button (146/346); wherein the first push button (144/344) is configured to allow a user to control a first amount of power provided to the first controlled receptacle (142(a)/342(a)) of the first enclosure (140/340) independent from a second amount of power provided to the second controlled receptacle (182(a)/482(a)) of the second enclosure (180/480); wherein the second push button (184/484) is configured to allow the user to control the second amount of power provided to the second controlled receptacle (182(a)/482(a)) independent from the first amount of power provided to the first controlled receptacle (142(a)/342(a)); and wherein in response to a user pressing the wall switch via the wall adapter (110/210) or the first synchronizing push button (146/346) of the first enclosure (140/340), the electrical control system is configured to synchronize the first amount of power and the second amount of power to normal system power controls.

An Embodiment A19, wherein the second enclosure of the electrical control system of Embodiment 5A further comprises a second synchronizing push button (186/486), wherein each of the first synchronizing push button (146/346) and the second synchronizing push button (186/486) is a system power control button and part of a synchronizing circuit configured to synchronize the electrical control system upon being pressed by a user, and wherein each of the first push button (144/344) and the second push button (184/484) is a local button configured to control a respective controlled receptacle of a respective enclosure without affecting that of another enclosure.

An Embodiment A20, wherein the first enclosure (140/340) of the electrical control system of Embodiment A12 further comprises a first synchronizing push button (146/346); wherein each of the first push button (146/346) and the second push button (184/484) is a local button configured to control a respective controlled receptable of a respective enclosure without affecting that of another enclosure; and wherein in response to a user pressing the wall switch via the wall adapter (110/210) or the first synchronizing push button (146/346), the electrical control system is configured to synchronize a first amount of power to the first controlled receptacle (342(a)) and a second amount of power to the second controlled receptacle (482(a)) to normal system power controls.

An Embodiment A21, wherein the second enclosure (180/480) of the electrical control system of Embodiment A20 further comprises a second synchronizing push button (186/486); and wherein an each of the first synchronizing push button (146/346) and the second synchronizing push button (186/486) is a system power control button and part of a synchronizing circuit configured to synchronize the electrical control system to normal system power controls in response to being pressed by a user.

An Embodiment A22, wherein the electrical control system of Embodiment A4 further comprises a second enclosure (680) and a third enclosure (660); wherein the third enclosure (660) is disposed between the first enclosure (640) and the second enclosure (680); wherein the second enclosure (680) comprises a second push button (684) in electrical connection with the third enclosure (660), a second 110 vac power cord (681), a second multiple pin cable (688), a fourth multiple pin connector (683), a second uncontrolled receptacle (682(b)), and a second controlled receptacle (682(a)) in electrical connection with a third IC board (500); wherein the third IC board (500) comprises a third dual FLIP-FLOP logic gate (512), a third quad NAND SCHMITT trigger logic gate (506), and at least one of a second OR logic gate (510) and a second AND logic gate (508), or multiple resistors (R17 thru R26) and multiple diodes (D10 thru D15), in electrical connection with a third isolating optocoupler (501) and a second TRIAC (505); and wherein the third enclosure (660) comprises a third push button (664) in electrical connection with the first enclosure (640) and the second enclosure (680), a third 110 vac power cord (661), a third uncontrolled receptacle (662(b)), a third controlled receptacle (662(a)), a third multiple pin cable (648), a fifth multiple pin connector (665), a sixth multiple pin connector (668) and a fourth IC board (700); wherein the fourth IC board (700) comprises a fourth dual FLIP-FLOP logic gate (758), a fourth quad NAND SCHMITT trigger logic gate (756), and at least one of a third OR logic gate (767) and a third AND logic gate (769), or multiple resistors (R27 thru R37) and multiple diodes (D16 thru D23), in electrical connection with a fourth isolating optocoupler (753) and a third TRIAC (751); and wherein the second multiple pin cable (688) is configured to electrically connect the second enclosure (680) at the fourth multiple pin connector (683) to the third enclosure (660) via the sixth multiple pin connector (668), and the third multiple pin cable (648) is configured to electrically connect the third enclosure (660) at the fifth multiple pin connector (665) to the first enclosure via the third multiple pin connector (645). The Embodiment A22 wherein each of the first push button (644), the second push button (684), and the third push button (664) is a local button configured to control a respective controlled receptable (642(a), 682(a), and 662(a)) of a respective enclosure (640, 680, and 660) without affecting that of another enclosure; and wherein the fourth IC board (700) of the third enclosure (660), the third IC board (500) of the second enclosure (680), the second IC board (350) of the first enclosure (140/440/640) and the wall switch via the wall adapter (110/610) are configured to control the second (353), third (501), and fourth (753) isolating optocouplers and the first (351), second (505), and third (751) TRIACs that are connected to the first (642(*a*)), second (682(*a*)), and third (662(*a*)) controlled receptacles in respective first (640), second (680), and third (660) enclosures in order to turn them on and off.

An Embodiment A23, wherein the first enclosure (640) of the electrical control system of Embodiment A22, wherein the first enclosure further comprises a first synchronizing push button (646), the second enclosure (680) further comprises a second synchronizing push button (686), and the third enclosure (660) further comprises a third synchronizing push button (666); and wherein each of the first synchronizing push button (646), the second synchronizing push button (686), and the third synchronizing push button (666) is a system power control button and part of a synchronizing circuit configured to synchronize the electrical control system to normal system power controls in response to being pressed by a user.

Embodiments of the instant disclosure utilizing integrated circuits incorporating a microcontroller configuration as illustrated in one or more of FIGS. 2A, 2D, 2E, 3A, 3E, 3F, 4A, 4E, 4F, 6D, and 6E are included below as various Embodiments "B."

Embodiments B

In an Embodiment B1, an electrical control system (100) configured to control an electrical device from two or more locations with independent control function, the electrical control system comprising: a wall adapter (210) and a first enclosure (140/340). The wall adapter (210) comprising a first set of polarized male plugs (212) and a first integrated circuit (IC) board (240), wherein the first set of polarized male plugs (212) is configured to provide electrical connection with a wall receptacle controlled by a single-pole wall switch; wherein the first IC board (240) comprises a first isolating optocoupler (235), a number of resistors (238(*a*), 238(*b*)), a diode (239), and a multiple pin connector (216) in electrical connection; and wherein the first IC board (240) is configured to convert a 110 vac latched signal in the wall receptacle to a 5 vdc momentary signal via the first isolating optocoupler (235). The first enclosure (140/340) comprising a first push button (344) in electrical connection with the wall adapter (110/210), a first 110 vac power cord (341), a first 5 vdc power supply, a first uncontrolled receptacle (342(*b*)), a first controlled receptacle (342(*a*)), a first multiple pin cable (318), a second multiple pin connector (343), and a second IC board (370); wherein the first multiple pin cable (318) is configured to electrically connect the first enclosure (340) at the second multiple pin connector (343) to the wall adapter (210) via the first multiple pin connector (216); wherein the second IC board (370) comprises a second isolating optocoupler (365) and a first TRIAC (361) in electrical connection with the first controlled receptacle (342(*a*)); wherein the first 110 vac power cord (341) is connected at a first end to an uncontrolled power source and at a second end to the first 5 vdc power supply via the first uncontrolled receptacle (342(*b*)); and wherein the second IC board (370) is connected to the first 5 vdc power supply and is configured to allow the first push button (344) of the first enclosure (340) and the wall switch via the wall adapter (210) to control the second isolating optocoupler (365) and the first TRIAC (361) to turn the electrical control system (100) on and off.

In an Embodiment B2, the electrical control system of Embodiment B1, wherein the second IC board (370) further comprises a microcontroller (368), a crystal oscillator (369), in electrical connection with the second isolating optocoupler (365) and a first TRIAC (361).

In an Embodiment B3, the electrical control system of Embodiment B2, further comprising a second enclosure (480), wherein the second enclosure (480) comprises a second push button (484), a second 110 vac power cord (481), a second multiple pin cable (448), a fourth multiple pin connector (483), a second uncontrolled receptacle (482(*b*)), and a second controlled receptacle (482(*a*)) in electrical connection with a third IC board (540); wherein the third IC board (540) comprises a third isolating optocoupler (541), and a second TRIAC (545) in electrical connection; wherein the second multiple pin cable (448) is configured to electrically connect the first enclosure (340) at a third multiple pin connector (345) to the second enclosure (480) via the fourth multiple pin connector (483); wherein the second enclosure (480) is configured to be controlled by the microcontroller (368) in the second IC board (370); and wherein the third IC board (540) of the second enclosure (480) and the second IC board (370) of the first enclosure (340) and the wall switch via the wall adapter (210) are configured to control the second isolating optocoupler (353) and the third isolating optocoupler (501) and the first TRIAC (351) and second TRIAC (505) that are connected to the first (142(*a*)/342(*a*)) and second controlled receptacles (182(*a*)/482(*a*)) in respective first (140/340) and second (180/480) enclosures in order to turn them on and off.

In an Embodiment B4, the electrical control system of Embodiment B3, wherein the first enclosure (340) further comprises a first synchronizing push button (346); wherein the first push button (344) is configured to allow a user to control a first amount of power provided to the first controlled receptacle (342(*a*)) of the first enclosure (340) independent from a second amount of power provided to the second controlled receptacle (482(*a*)) of the second enclosure (480); wherein the second push button (484) is configured to allow the user to control the second amount of power provided to the second controlled receptacle (482(*a*)) independent from the first amount of power provided to the first controlled receptacle (342(*a*)); and wherein in response to a user pressing the wall switch via the wall adapter (210) or the first synchronizing push button (346) of the first enclosure (340), the electrical control system is configured to synchronize the first amount of power and the second amount of power to normal system power controls.

In an Embodiment B5, the electrical control system of Embodiment B4, wherein the second enclosure (480) further comprises a second synchronizing push button (486); wherein each of the first synchronizing push button (346) and the second synchronizing push button (486) is a system power control button and part of a synchronizing circuit configured to synchronize the electrical control system upon being pressed by a user; and wherein each of the first push button (344) and the second push button (484) is a local button configured to control a respective controlled receptable of a respective enclosure without affecting that of another enclosure.

In an Embodiment B6, the electrical control system of Embodiment B1, wherein the wall adapter (210) further comprises a second set of polarized male plugs (not shown) and is configured to connect with an uncontrolled side of a half/split circuit wall receptacle.

In an Embodiment B7, the electrical control system of Embodiment B4, wherein the wall adapter (210) further comprises a LED night light (not shown) electrically connected to a photo sensor (not shown).

In an Embodiment B8, the electrical control system of Embodiment B1, further comprising a second enclosure (180/480), wherein the second enclosure (480) comprises a second push button (484) in electrical connection with the first enclosure (340).

In an Embodiment B9, the electrical control system of Embodiment B1, wherein the wall adapter (210) further comprises at least one uncontrolled USB charging port (not shown).

In an Embodiment B10, the electrical control system of Embodiment B1, wherein the first enclosure (340) further comprises at least one uncontrolled USB charging port (not shown).

In an Embodiment B11, the electrical control system of Embodiment B3, wherein the second enclosure (480) further comprises at least one uncontrolled USB charging port (not shown).

In an Embodiment B12, an electrical control system (100) configured to control an electrical device from two or more locations, the electrical control system comprising a wall adapter (210), a first enclosure (340), and a second enclosure (480). The wall adapter comprising a first set of polarized male plugs (212) and a first integrated circuit (IC) board (240), wherein the first set of polarized male plugs (212) is configured to provide electrical connection with a wall receptacle controlled by a single-pole wall switch; wherein the first IC board (240) comprises a first isolating optocoupler (235), a number of resistors (238(a), 238(b)), a diode (239), and a first multiple pin connector (216) in electrical connection; and wherein the first IC board (240) is configured to convert a 110 vac latched signal to a 5 vdc momentary signal via the first isolating optocoupler (235). The first enclosure (340) comprising a first push button (344) in electrical connection with the wall adapter (210), and configured to provide a 5 vdc momentary signal from a 110 vac wall switch in electrical connection with the first enclosure (340); wherein the first enclosure (340) further comprises a first 110 vac power cord (341), a first multiple pin cable (318), a second multiple pin connector (343), a third multiple pin connector (345), a first uncontrolled receptacle (342(b)), and a first controlled receptacle (342(a)) in electrical connection with a second IC board (370); wherein the second IC board (370) comprises a second isolating octocoupler (365), and a first TRIAC (361) in electrical connection; and wherein the first multiple pin cable (318) is configured to connect the first IC board (240) at the first multiple pin connector (216) to the second IC board (370) and its first 5 vdc power supply via the second multiple pin connector (343). The second enclosure (480) comprising a second push button (484), a second 110 vac power cord (481), a second multiple pin cable (448), a fourth multiple pin connector (483), a second uncontrolled receptacle (482(b)), and a second controlled receptacle (482(a)) in electrical connection with a third IC board (540); wherein the third IC board (540) comprises a third isolating optocoupler (541), and a second TRIAC (545) in electrical connection; wherein the second multiple pin cable (448) is configured to electrically connect the second IC board (350) at the third multiple pin connector (145/345) to the third IC board (500) via the fourth multiple pin connector (483); and wherein the electrical connection between the first IC board (240), the second IC board (370), and the third IC board (500) is configured to allow the wall switch via the wall adapter (110/210), the first push button (344) of the first enclosure (340), and the second push button (484) of the second enclosure (480) to turn the first (342(a)) and second controlled receptacles (482(a)) on and off.

In an Embodiment B13, the electrical control system of Embodiment B12, wherein the wall adapter (110/210) further comprises a second set of polarized male plugs (not shown) configured to connect with an uncontrolled side of a half/split circuit wall receptacle.

In an Embodiment B14, the electrical control system of Embodiment B13, wherein the wall adapter (110/210) further comprises a LED night light (not shown) electrically connected to a photo sensor (not shown).

In an Embodiment B15, the electrical control system of Embodiment 12, wherein the wall adapter (110/210) further comprises at least one uncontrolled USB charging port (not shown).

In an Embodiment B16, the electrical control system of Embodiment 12, wherein the first enclosure (140/340) further comprises at least one uncontrolled USB charging port (not shown).

In an Embodiment B17, the electrical control system of Embodiment 12, wherein the second enclosure (180/480) further comprises at least one uncontrolled USB charging port (not shown).

In an Embodiment B18, the electrical control system of Embodiment B12, wherein the first enclosure (340) further comprises a first synchronizing push button (146/346); wherein the first push button (144/344) is configured to allow a user to control a first amount of power provided to the first controlled receptacle (142(a)/342(a)) of the first enclosure (140/340) independent from a second amount of power provided to the second controlled receptacle (182(a)/482(a)) of the second enclosure (180/480); wherein the second push button (184/484) is configured to allow the user to control the second amount of power provided to the second controlled receptacle (182(a)/482(a)) independent from the first amount of power provided to the first controlled receptacle (142(a)/342(a)); and wherein in response to a user pressing the wall switch via the wall adapter (110/210) or the first synchronizing push button (146/346) of the first enclosure (140/340), the electrical control system is configured to synchronize the first amount of power and the second amount of power to normal system power controls.

In an Embodiment B19, the electrical control system of Embodiment B18, wherein the second enclosure further comprises a second synchronizing push button (186/486); wherein each of the first synchronizing push button (146/346) and the second synchronizing push button (186/486) is a system power control button and part of a synchronizing circuit configured to synchronize the electrical control system upon being pressed by a user; and wherein each of the first push button (144/344) and the second push button (184/484) is a local button configured to control a respective controlled receptacle of a respective enclosure without affecting that of another enclosure.

In an Embodiment B20, the electrical control system of Embodiment B12, wherein the first enclosure (140/340) further comprises a first synchronizing push button (146/346), wherein each of the first push button (146/346) and the second push button (184/484) is a local button configured to control a respective controlled receptable of a respective enclosure without affecting that of another enclosure; and wherein in response to a user pressing the wall switch via the wall adapter (110/210) or the first synchronizing push button (146/346), the electrical control system is configured to synchronize a first amount of power to the first controlled receptacle (342(a)) and a second amount of power to the second controlled receptacle (482(a)) to normal system power controls.

In an Embodiment B21, the electrical control system of Embodiment B20, wherein the second enclosure (180/480) further comprises a second synchronizing push button (186/486); and wherein each of the first synchronizing push button (146/346) and the second synchronizing push button (186/486) is a system power control button and part of a synchronizing circuit configured to synchronize the electrical control system to normal system power controls in response to being pressed by a user.

In an Embodiment B22, the electrical control system of Embodiment B4, further comprising a second enclosure (680) and a third enclosure (660); wherein the third enclosure (660) is disposed between the first enclosure (640) and the second enclosure (680); wherein the second enclosure (680) comprises a second push button (684) in electrical connection with the third enclosure (660), a second 110 vac power cord (681), a second multiple pin cable (688), a fourth multiple pin connector (683), a second uncontrolled receptacle (682(b)), and a second controlled receptacle (682(a)) in electrical connection with a third IC board (540); wherein the third IC board (540) comprises a third isolating optocoupler (541) and a second TRIAC (545) in electrical connection; wherein the third enclosure (660) comprises a third push button (664) in electrical connection with the first enclosure (640) and the second enclosure (680), a third 110 vac power cord (661), a third uncontrolled receptacle (662(b)), a third controlled receptacle (662(a)), a third multiple pin cable (648), a fifth multiple pin connector (665), a sixth multiple pin connector (668) and a fourth IC board (760); wherein the fourth IC board (760) comprises a fourth isolating optocoupler (763) and a third TRIAC (761) in electrical connection; wherein the second multiple pin cable (688) is configured to electrically connect the second enclosure (680) at the fourth multiple pin connector (683) to the third enclosure (660) via the sixth multiple pin connector (668), and the third multiple pin cable (648) is configured to electrically connect the third enclosure (660) at the fifth multiple pin connector (665) to the first enclosure via the third multiple pin connector (645); wherein each of the first push button (644), the second push button (684), and the third push button (664) is a local button configured to control a respective controlled receptable (642(a), 682(a), and 662(a)) of a respective enclosure (640, 680, and 660) without affecting that of another enclosure; and wherein the fourth IC board (760) of the third enclosure (660), the third IC board (500) of the second enclosure (680), the second IC board (350) of the first enclosure (140/440/640) and the wall switch via the wall adapter (110/610) are configured to control the second (353), third (501), and fourth (763) isolating optocouplers and the first (351), second (505), and third (761) TRIACs that are connected to the first (642(a)), second (682(a)), and third (662(a)) controlled receptacles in respective first (640), second (680), and third (660) enclosures in order to turn them on and off.

In an Embodiment B23, the electrical control system of Embodiment B22, wherein the first enclosure (640) further comprises a first synchronizing push button (646), the second enclosure (680) further comprises a second synchronizing push button (686), and the third enclosure (660) further comprises a third synchronizing push button (666); and wherein each of the first synchronizing push button (646), the second synchronizing push button (686), and the third synchronizing push button (666) is a system power control button and part of a synchronizing circuit configured to synchronize the electrical control system to normal system power controls in response to being pressed by a user.

Embodiments of the instant disclosure utilizing integrated circuits as illustrated in one or more of FIGS. 2A thru 2E, FIGS. 3A thru 3F, FIGS. 4A thru 4F, and FIGS. 6A thru 6E are included below as various Embodiments "C."

Embodiments C

In an Embodiment C1, an electrical control system (100) configured to control an electrical device from two or more locations, the electrical control system comprising: a wall adapter (110/210) including a first IC board (200/220/240); a first enclosure (140/340) comprising a first push button (144/344), a first synchronizing push button (146/346), and a second IC board (350/360/370) electrically connected to the wall adapter (110/340); and a second enclosure (180/480) comprising a second push button (184/484), a second synchronizing push button (186/486), and a third IC board (500/530/540); wherein each of the wall switch via the wall adapter (110/210), the first synchronizing push button (146), and the second synchronizing push button (186), is a system power control button and part of a synchronizing circuit configured to synchronize the electrical control system (100) to normal system power controls, upon being pressed by a user; and wherein each of the first push button (144) and the second push button (184) is a local button configured to control a respective controlled receptable of a respective enclosure without affecting that of another enclosure.

In an Embodiment C2, the electrical control system (100) of Embodiment C1, wherein the wall adapter (200) comprises a first set of polarized male plugs (212) configured to provide electrical connection with a wall receptacle controlled by a single-pole wall switch.

In an Embodiment C3, the electrical control system of Embodiment C2, wherein the first IC board (220) comprises a first isolating optocoupler (225), a first dual FLIP-FLOP logic gate (221), a first quad NAND SCHMITT trigger logic gate (222), a pulse generator (223), and a first multiple connector (216) in electrical connection; and wherein the first IC board (220) is configured to convert a 110 vac latched signal in the wall receptacle to a 5 vdc momentary signal via the first isolating optocoupler (225).

In an Embodiment C4, the electrical control system of Embodiment C3, wherein the first enclosure (300) further comprises a first 110 vac power cord (341), a first 5 vdc power supply, a first uncontrolled receptacle (142(b)/342(b)), a first controlled receptacle (142(a)/342(a)), a first multiple cable (118/318), and a second multiple connector (143/343); wherein the first multiple cable (118/318) is configured to electrically connect the first enclosure (140/300) at the second multiple connector (143/343) to the wall adapter (110/200) via the first multiple connector (116/216); wherein the second IC board (350) comprises a second isolating optocoupler (353) and a first TRIAC (351) in electrical connection with the first controlled receptacle (142(a)/341(a)); wherein the first 110 vac power cord (141/341) is connected at a first end to an uncontrolled power source and at a second end to the first 5 vdc power supply via the first uncontrolled receptacle (142(b)/342(b)); and wherein the second IC board (350) is connected to the first 5 vdc power supply and is configured to allow the first push button (144/344) of the first enclosure (140/300) and the wall switch via the wall adapter (110/200) to control the second isolating optocoupler (353) and the first TRIAC (351) to turn the electrical control system (100) on and off.

In an Embodiment C5, The electrical control system of Embodiment C1, wherein the second IC board (350) further comprises a second dual FLIP-FLOP logic gate (358), a second quad NAND SCHMITT trigger logic gate (356), a first OR logic gate (357), and a first AND logic gate (359) in electrical connection with the second isolating optocoupler (353) and the first TRIAC (351).

In an Embodiment C6, the electrical control system of Embodiment C5, wherein the second enclosure (180/400) further comprises a second 110 vac power cord (181/481), a second multiple cable (148/448), a second uncontrolled receptacle (182(b)/482(b)), and a second controlled receptacle (182(a)/482(a)) in electrical connection with the third IC board (500); wherein the third IC board (500) comprises a third dual FLIP-FLOP logic gate (512), a second AND logic gate (508), a second OR logic gate (510), a third quad NAND SCHMITT trigger logic gate (506), a third isolating optocoupler (501), and a second TRIAC (505) in electrical connection; wherein the second multiple cable (148/448) is configured to electrically connect the first enclosure (140/300) at a third multiple connector (145/345) to the second enclosure (180/400) via the fourth multiple connector (183/483); and wherein the third IC board (500), the second IC board (350), and the wall switch via the wall adapter (110/200) are configured to control the second isolating optocoupler (353) and the third isolating optocoupler (501) and the first TRIAC (351) and second TRIAC (505) that are connected to the first (142(a)/342(a)) and second controlled receptacles (182(a)/482(a)) in respective first (140/300) and second (180/400) enclosures in order to turn them on and off.

In an Embodiment C7, the electrical control system of Embodiment C6, further comprising a third enclosure (660) disposed between the first enclosure (640) and the second enclosure (680). The third enclosure comprising a third push button (664), a third synchronizing push button (666), a third 110 vac power cord (661), a third uncontrolled receptacle (662(b)), a third controlled receptacle (662(a)), a third multiple cable (648), a fifth multiple connector (665), a sixth multiple connector (668), and a fourth IC board (700) electrically connected to the first enclosure (640) and the second enclosure (680); wherein the fourth IC board (700) comprises a fourth dual FLIP-FLOP logic gate (758), a third AND logic gate (759), a third OR logic gate (757), a fourth quad NAND SCHMITT trigger logic gate (756), a fourth isolating optocoupler (753), and a third TRIAC (751) in electrical connection; wherein the second multiple cable (688) is configured to electrically connect the second enclosure (680) at the fourth multiple connector (683) to the third enclosure (660) via the sixth multiple connector (668), and the third multiple cable (648) is configured to electrically connect the third enclosure (660) at the fifth multiple connector (665) to the first enclosure via the third multiple connector (645); and wherein the third push button (664) is a local button configured to control the third controlled receptacle (662(a)) without affecting the respective controlled receptacle of another enclosure, and the third synchronizing push button (666) is a system power control button and part of the synchronizing circuit configured to synchronize the electrical control system (600) to normal system power controls, upon being pressed by the user.

In an Embodiment C8, the electrical control system of Embodiment C1, further comprising a third enclosure (660) disposed between the first enclosure (640) and the second enclosure (680), wherein the third enclosure comprises a third push button (664), a third synchronizing push button (666), and a fourth IC board (700 or 760) electrically connected to the first enclosure (640) and the second enclosure (680); wherein the third synchronizing push button (666) is a system control button and part of the synchronizing circuit configured to synchronize the electrical control system (600) to normal system power controls upon being pressed by a user; and wherein the third push button (664) is a local button configured to control a respective controlled receptable (662(a)) of the third enclosure without affecting that of another enclosure.

In an Embodiment C9, the electrical control system of Embodiment C2, wherein the first IC board (240) comprises a first isolating optocoupler (235), a number of resistors (R1, R2), a diode (239), and a first multiple connector (216) in electrical connection; and wherein the first IC board (240) is configured to convert a 110 vac latched signal in the wall receptacle to a 5 vdc momentary signal via the first isolating optocoupler (235).

In an Embodiment C10, the electrical control system of Embodiment C9, wherein the first enclosure (140/300) further comprises a first 110 vac power cord (341), a first 5 vdc power supply, a first uncontrolled receptacle (342(b)), a first controlled receptacle (342(a)), a first multiple cable (318), and a second multiple connector (343); wherein the first multiple cable (318) is configured to electrically connect the first enclosure (300) at the second multiple connector (343) to the wall adapter (200) via the first multiple connector (216); wherein the second IC board (370) comprises a second isolating optocoupler (365) and a first TRIAC (361) in electrical connection with the first controlled receptacle (342(a)); wherein the first 110 vac power cord (341) is connected at a first end to an uncontrolled power source and at a second end to the first 5 vdc power supply via the first uncontrolled receptacle (342(b)); and wherein the second IC board (370) is connected to the first 5 vdc power supply and is configured to allow the first push button (344) of the first enclosure (300) and the wall switch via the wall adapter (200) to control the second isolating optocoupler (365) and the first TRIAC (361) to turn the electrical control system (100) on and off.

In an Embodiment C11, the electrical system of Embodiment C10, wherein the second IC board (370) further comprises a microcontroller (368) and a crystal oscillator (369) in electrical connection with the second isolating optocoupler (365) and the first TRIAC (361).

In an Embodiment C12, the electrical control system of Embodiment C11, wherein the second enclosure (400) further comprises a second 110 vac power cord (481), a second multiple pin cable (448), a fourth multiple pin connector (483), a second uncontrolled receptacle (482(b)), and a second controlled receptacle (482(a)) in electrical connection with the third IC board (540). The third IC board (540) comprising a third isolating optocoupler (541), and a second TRIAC (545) in electrical connection; wherein the second multiple pin cable (448) is configured to electrically connect the first enclosure (300) at a third multiple pin connector (345) to the second enclosure (480) via the fourth multiple pin connector (483); wherein the second enclosure (480) is configured to be controlled by the microcontroller (368) in the second IC board (300, 370); and wherein the third IC board (400, 540) of the second enclosure and the second IC board (300, 370) of the first enclosure (340) and the wall switch via the wall adapter (200) are configured to control the second isolating optocoupler (353) and the third isolating optocoupler (501) and the first TRIAC (351) and second TRIAC (505) that are connected to the first (142(a)/342(a)) and second controlled receptacles (182(a)/482(a)) in respective first (140/340) and second (180/480) enclosures in order to turn them on and off.

In an Embodiment C13, the electrical control system of Embodiment C12, further comprising a third enclosure (660) disposed between the first enclosure (640) and the second enclosure (680); wherein the third enclosure comprises a third push button (664), a third synchronizing push button (666), a third 110 vac power cord (661), a third uncontrolled receptacle (662(b)), a third controlled receptacle (662(a)), a third multiple cable (648), a fifth multiple connector (665), a sixth multiple connector (668), and a fourth IC board (760) electrically connected to the first enclosure (640) and the second enclosure (680); wherein the fourth IC board (760) comprises a fourth isolating optocoupler (762), and a third TRIAC (761) in electrical connection; wherein the second multiple cable (688) is configured to electrically connect the second enclosure (680) at the fourth multiple connector (683) to the third enclosure (660) via the sixth multiple connector (668), and the third multiple cable (648) is configured to electrically connect the third enclosure (660) at the fifth multiple connector (665) to the first enclosure via the third multiple connector (645); and wherein the third push button (664) is a local button configured to control the third controlled receptable (662(a)) without affecting the respective controlled receptacle of another enclosure; and wherein the third synchronizing push button (666) is a system power control button and part of the synchronizing circuit configured to synchronize the electrical control system (600) to normal system power controls, upon being pressed by the user.

In an Embodiment C14, an electrical control system (600) configured to control an electrical device from two or more locations, the electrical control system comprising: a wall adapter (610), a first enclosure (640), a second enclosure (680), and a third enclosure (660). The wall adapter (610) including a first IC board (220 or 240). The first enclosure comprising a first push button (644), a first synchronizing push button (646), and a second IC board (350 or 370) electrically connected to the wall adapter (610). The second enclosure (680) comprising a second push button (686), a second synchronizing push button (684), and a third IC board (500 or 540). The third enclosure (660) disposed between the first enclosure (640) and the second enclosure (680), the third enclosure comprising a third push button (664), a third synchronizing push button (666), and a fourth IC board (700 or 750) electrically connected to the first enclosure (640) and the second enclosure (680). In this embodiment, each of the wall switch via the wall adapter (610), the first synchronizing push button (646), the second synchronizing push button (686), and the third synchronizing push button (666) is a system power control button and part of a synchronizing circuit configured to synchronize the electrical control system (600) to normal system power controls, upon being pressed by a user, and wherein each of the first push button (644), the second push button (686), and the third push button (666) is a local button configured to control a respective controlled receptable of a respective enclosure without affecting that of another enclosure.

In an Embodiment C15, the electrical control system of Embodiment C14, wherein the first IC board (220) comprises a first isolating optocoupler (225), a first dual FLIP-FLOP logic gate (221), a first quad NAND SCHMITT trigger logic gate (222), a pulse generator (223), and a first multiple connector (216) in electrical connection; and wherein the first IC board (220) is configured to convert a 110 vac latched signal in the wall receptacle to a 5 vdc momentary signal via the first isolating optocoupler (225).

In an Embodiment C16, the electrical control system of Embodiment C15, wherein the first enclosure (300) further comprises a first 110 vac power cord (341), a first 5 vdc power supply (302), a first uncontrolled receptacle (642(b)/342(b)), a first controlled receptacle (642(a)/342(a)), a first multiple cable (618/318), and a second multiple connector (643/343); and wherein the first multiple cable (618/318) is configured to electrically connect the first enclosure at the second multiple connector (643/343) to the wall adapter (610/210) via the first multiple connector (616/216). The second IC board (360) comprising a second isolating optocoupler (353), a first TRIAC (351), a second dual FLIP-FLOP logic gate (358), a second quad NAND SCHMITT trigger logic gate (356), a first OR logic gate (357), and a first AND logic gate (359) in electrical connection with the first controlled receptacle (642(a)/341(a)); wherein the first 110 vac power cord (641/341) is connected at a first end to an uncontrolled power source and at a second end to the first 5 vdc power supply (302) via the first uncontrolled receptacle (142(b)/342(b)); and wherein the second IC board (360) is connected to the first 5 vdc power supply and is configured to allow the first push button (644/344) of the first enclosure (640/340) and the wall switch via the wall adapter (610/210) to control the second isolating optocoupler (353) and the first TRIAC (351) to turn the electrical control system (600) on and off.

In an Embodiment C17, the electrical control system of Embodiment C16, wherein the second enclosure (680) further comprises a second 110 vac power cord (681), a second multiple cable (688), a fourth multiple pin connector (683), a second uncontrolled receptacle (682(b)), and a second controlled receptacle (682(a)) in electrical connection with the third IC board (530); and wherein the third IC board (530) comprises a third dual FLIP-FLOP logic gate (512), a third quad NAND Schmitt trigger logic gate (506), a second AND logic gate (508), a second OR logic gate (510), a third isolating optocoupler (501), and a second TRIAC (505) in electrical connection. The third enclosure (660) comprising a third push button (664) in electrical connection with the first enclosure (640) and the second enclosure (680), a third 110 vac power cord (661), a third uncontrolled receptacle (662(b)), a third controlled receptacle (662(a)), a third multiple pin cable (648), a fifth multiple pin connector (665), a sixth multiple pin connector (668) and a fourth IC board (740); wherein the fourth IC board (740) comprises a fourth dual FLIP-FLOP logic gate (758), a fourth quad NAND Schmitt trigger logic gate (756), a third AND logic gate (767), a third OR logic gate (769), a fourth isolating optocoupler (753), and a third TRIAC (751) in electrical connection; and wherein the second multiple cable (688) is configured to electrically connect the second enclosure (680) at the fourth multiple connector (683) to the third enclosure (660) via the sixth multiple connector (668), and the third multiple cable (648) is configured to electrically connect the third enclosure (660) at the fifth multiple connector (665) to the first enclosure (640) via the third multiple connector (645). In this embodiment, the fourth IC board (740) of the third enclosure (660), the third IC board (530) of the second enclosure (680), the second IC board (360) of the first enclosure (640) and the wall switch via the wall adapter (610) are configured to control the second (353), third (501), and fourth (753) isolating optocouplers and the respective first (351), second (505), and third (751) TRIACs that are connected to the first (642(a)), second (682(a)), and third (662(a)) controlled receptacles in respective first (640), second (680), and third (660) enclosures in order to turn them on and off.

In an Embodiment C18, the electrical control system of Embodiment C14, wherein the first IC board (240) comprises a first isolating optocoupler (235), a number of resistors (R1, R2), a diode (D1), and a first multiple connector (216) in electrical connection; and wherein the first IC board (240) is configured to convert a 110 vac latched signal in the wall receptacle to a 5 vdc momentary signal via the first isolating optocoupler (235). The first enclosure (640) further comprises a first 110 vac power cord (641), a first 5 vdc power supply (302), a first uncontrolled receptacle (642(b)), a first multiple pin cable (618), a second multiple connector (643), and a first controlled receptacle (642(a)) in electrical connection with the second IC board (370); wherein the first multiple cable (618) is configured to electrically connect the first enclosure (640) at the second multiple connector (643) to the wall adapter (610) via the first multiple connector (616); and wherein the first 110 vac power cord (641) is connected at a first end to an uncontrolled power source and at a second end to the first 5 vdc power supply (302) via the first uncontrolled receptacle (642(b)). The second IC board (370) comprises a second isolating optocoupler (365), a first TRIAC (361), a microcontroller (368) and a crystal oscillator (369) in electrical connection. The second enclosure (680) further comprises a second 110 vac power cord (681), a second multiple pin cable (648), a fourth multiple pin connector (683), a second uncontrolled receptacle (682(b)), and a second controlled receptacle (682(a)) in electrical connection with the third IC board (540); and wherein the third IC board (540) comprises a third isolating optocoupler (541) and a second TRIAC (545) in electrical connection; and wherein the second enclosure (680) is configured to be controlled by the microcontroller (368) in the second IC board (370).

In an Embodiment C19, the electrical control system of Embodiment C18, wherein the third enclosure (660) further comprises a third 110 vac power cord (661), a third uncontrolled receptacle (662(b)), a third multiple cable (648), a fifth multiple pin connector (665), a sixth multiple pin connector (668), and a third controlled receptacle (662(a)) in electrical connection with the fourth IC board (760), the first enclosure (640), and the second enclosure (680).

In an Embodiment C20, the electrical system of Embodiment C19, wherein the fourth IC board (760) comprises a fourth isolating optocoupler (762), and a third TRIAC (761) in electrical connection; and wherein the second multiple pin cable (688) is configured to electrically connect the second enclosure (680) at the fourth multiple pin connector (683) to the third enclosure (660) via the sixth multiple pin connector (668), and the third multiple cable (648) is configured to electrically connect the third enclosure (660) at the fifth multiple connector (665) to the first enclosure via the third multiple connector (645).

Although the present invention has been described by way of example, it should be appreciated that variations and modifications may be made without departing from the scope of the invention. Furthermore, where known equivalents exist to specific features, such equivalents are incorporated as if specifically referred to in this specification.

I claim:

1. An electrical control system configured to control an electrical device from two or more locations, the electrical control system comprising:
   a wall adapter comprising a first IC board and a first set of polarized male plugs configured to provide electrical connection with a wall receptacle controlled by a single-pole wall switch;
   a first enclosure comprising a first push button, a first synchronizing push button, and a second IC board electrically connected to the wall adapter; and
   a second enclosure comprising a second push button, a second synchronizing push button, and a third IC board,
   wherein each of the wall switch via the wall adapter, the first synchronizing push button, and the second synchronizing push button, is a system power control button and part of a synchronizing circuit configured to synchronize the electrical control system to normal system power controls, upon being pressed by a user,
   wherein each of the first push button and the second push button is a local button configured to control a respective controlled receptable of a respective enclosure without affecting that of another enclosure,
   wherein the first IC board comprises a first isolating optocoupler, a number of resistors, at least one diode, and a first multiple-pin connector in electrical connection; and
   wherein the first IC board is configured to convert a 110 vac latched signal in the wall receptacle to a 5 vdc momentary signal via the first isolating optocoupler.

2. The electrical control system of claim 1, wherein the first enclosure further comprises a first 110 vac power cord, a first 5 vdc power supply, a first uncontrolled receptacle, a first controlled receptacle, a first multiple-pin cable, and a second multiple-pin connector,
   wherein the first multiple-pin cable is configured to electrically connect the first enclosure at the second multiple-pin connector to the wall adapter via the first multiple-pin connector,
   wherein the second IC board comprises a second isolating optocoupler and a first TRIAC in electrical connection with the first controlled receptacle,
   wherein the first 110 vac power cord is connected at a first end to an uncontrolled power source and at a second end to the first 5 vdc power supply via the first uncontrolled receptacle, and
   wherein the second IC board is connected to the first 5 vdc power supply and is configured to allow the first push button of the first enclosure and the wall switch via the wall adapter to control the second isolating optocoupler and the first TRIAC to turn the electrical control system on and off.

3. The electrical control system of claim 2, wherein the second IC board further comprises a microcontroller and a crystal oscillator in electrical connection with the second isolating optocoupler and the first TRIAC.

4. The electrical control system of claim 3, wherein the second enclosure further comprises a second 110 vac power cord, a second multiple pin cable, a fourth multiple pin connector, a second uncontrolled receptacle, and a second controlled receptacle in electrical connection with the third IC board,
   wherein the third IC board further comprises a third isolating optocoupler, and a second TRIAC in electrical connection,
   wherein the second multiple pin cable is configured to electrically connect the first enclosure at a third multiple pin connector to the second enclosure via the fourth multiple pin connector,
   wherein the second enclosure is configured to be controlled by the microcontroller in the second IC board, and
   wherein the third IC board, the second IC board, and the wall switch via the wall adapter are configured to control the second isolating optocoupler and the third isolating optocoupler and the first TRIAC and second TRIAC that are connected to the first and second controlled receptacles in respective first and second enclosures in order to turn them on and off.

5. The electrical control system of claim 4, further comprising a third enclosure disposed between the first enclosure and the second enclosure,
wherein the third enclosure comprises a third push button, a third synchronizing push button, a third 110 vac power cord, a third uncontrolled receptacle, a third controlled receptacle, a third multiple-pin cable, a fifth multiple-pin connector, a sixth multiple-pin connector, and a fourth IC board electrically connected to the first enclosure and the second enclosure;
wherein the fourth IC board comprises a fourth isolating optocoupler, and a third TRIAC in electrical connection,
wherein the second multiple-pin cable is configured to electrically connect the second enclosure at the fourth multiple-pin connector to the third enclosure via the sixth multiple-pin connector, and the third multiple-pin cable is configured to electrically connect the third enclosure at the fifth multiple-pin connector to the first enclosure via the third multiple-pin connector, and
wherein the third push button is a local button configured to control the third controlled receptable without affecting the respective controlled receptacle of another enclosure, and the third synchronizing push button is a system power control button and part of the synchronizing circuit configured to synchronize the electrical control system to normal system power controls, upon being pressed by the user.

6. The electrical control system of claim 1, wherein the first IC board further comprises a first dual FLIP-FLOP logic gate, a first quad NAND Schmitt trigger logic gate, and a pulse generator in electrical connection with the first isolating optocoupler.

7. The electrical control system of claim 6, wherein the first enclosure further comprises a first 110 vac power cord, a first 5 vdc power supply, a first uncontrolled receptacle, a first controlled receptacle, a first multiple-pin cable, and a second multiple-pin connector,
wherein the first multiple-pin cable is configured to electrically connect the first enclosure at the second multiple-pin connector to the wall adapter via the first multiple-pin connector,
wherein the second IC board comprises a second isolating optocoupler and a first TRIAC in electrical connection with the first controlled receptacle,
wherein the first 110 vac power cord is connected at a first end to an uncontrolled power source and at a second end to the first 5 vdc power supply via the first uncontrolled receptacle, and
wherein the second IC board is connected to the first 5 vdc power supply and is configured to allow the first push button of the first enclosure and the wall switch via the wall adapter to control the second isolating optocoupler and the first TRIAC to turn the electrical control system on and off.

8. The electrical control system of claim 7, wherein the second IC board further comprises a second dual FLIP-FLOP logic gate, a second quad NAND Schmitt trigger logic gate, a number of diodes, and multiple resistors in electrical connection with the first controlled receptacle.

9. The electrical control system of claim 8, wherein the second enclosure further comprises a second 110 vac power cord, a second multiple pin cable, a fourth multiple pin connector, a second uncontrolled receptacle, and a second controlled receptacle in electrical connection with the third IC board,
wherein the third IC board comprises a third isolating optocoupler, a second TRIAC, a number of diodes, and multiple resistors in electrical connection,
wherein the second multiple pin cable is configured to electrically connect the first enclosure at a third multiple pin connector to the second enclosure via the fourth multiple pin connector, and
wherein the third IC board, the second IC board, and the wall switch via the wall adapter are configured to control the second isolating optocoupler and the third isolating optocoupler and the first TRIAC and second TRIAC that are connected to the first and second controlled receptacles in respective first and second enclosures in order to turn them on and off.

10. The electrical control system of claim 9, further comprising a third enclosure disposed between the first enclosure and the second enclosure,
wherein the third enclosure comprises a third push button, a third synchronizing push button, a third 110 vac power cord, a third uncontrolled receptacle, a third controlled receptacle, a third multiple-pin cable, a fifth multiple-pin connector, a sixth multiple-pin connector, and a fourth IC board electrically connected to the first enclosure and the second enclosure;
wherein the fourth IC board comprises a fourth isolating optocoupler and a third TRIAC in electrical connection, and
wherein the second multiple-pin cable is configured to electrically connect the second enclosure at the fourth multiple-pin connector to the third enclosure via the sixth multiple-pin connector, and the third multiple-pin cable is configured to electrically connect the third enclosure at the fifth multiple-pin connector to the first enclosure via the third multiple-pin connector.

11. The electrical control system of claim 10, wherein the third push button is a local button configured to control the third controlled receptable without affecting the respective controlled receptacle of another enclosure, and the third synchronizing push button is a system power control button and part of the synchronizing circuit configured to synchronize the electrical control system to normal system power controls, upon being pressed by the user.

12. The electrical control system of claim 11, wherein the fourth IC board further comprises a fourth dual FLIP-FLOP logic gate, a fourth quad NAND Schmitt trigger logic gate, a number of diodes, and multiple resistors in electrical connection with the fourth isolating optocoupler and the third TRIAC.

13. The electrical control system of claim 12, wherein the fourth IC board, the third IC board, the second IC board, and the wall switch via the wall adapter are configured to control the second, third, and fourth isolating optocouplers and the respective first, second, and third TRIACs that are connected to the first, second, and third controlled receptacles in respective first, second, and third enclosures in order to turn them on and off.

14. The electrical control system of claim 5, wherein the fourth IC board further comprises a number of diodes and multiple resistors in electrical connection with the fourth isolating optocoupler and the third TRIAC.

15. The electrical control system of claim 14, wherein the fourth IC board, the third IC board, the second IC board, and the wall switch via the wall adapter are configured to control the second, third, and fourth isolating optocouplers and the respective first, second, and third TRIACs that are connected to the first, second, and third controlled receptacles in respective first, second, and third enclosures in order to turn them on and off.

16. An electrical control system configured to control an electrical device from two or more locations with independent control function, the electrical control system comprising:
a wall adapter comprising a first set of polarized male plugs and a first integrated circuit (IC) board, wherein the first set of polarized male plugs is configured to provide electrical connection with a wall receptacle controlled by a single-pole wall switch,
wherein the first IC board comprises a first isolating optocoupler, a number of resistors, a diode, and a multiple pin connector in electrical connection, and
wherein the first IC board is configured to convert a 110 vac latched signal in the wall receptacle to a 5 vdc momentary signal via the first isolating optocoupler;
a first enclosure comprising a first push button in electrical connection with the wall adapter, a first 110 vac power cord, a first 5 vdc power supply, a first uncontrolled receptacle, a first controlled receptacle, a first multiple pin cable, a second multiple pin connector, and a second IC board,
wherein the first multiple pin cable is configured to electrically connect the first enclosure at the second multiple pin connector to the wall adapter via the first multiple pin connector,
wherein the second IC board comprises a second isolating optocoupler, a first TRIAC, a microcontroller, and a crystal oscillator in electrical connection with the first controlled receptacle, and
wherein the first 110 vac power cord is connected at a first end to an uncontrolled power source and at a second end to the first 5 vdc power supply via the first uncontrolled receptacle; and
a second enclosure comprising a second push button, a second 110 vac power cord, a second multiple pin cable, a fourth multiple pin connector, a second uncontrolled receptacle, and a second controlled receptacle in electrical connection with a third IC board,
wherein the third IC board comprises a third isolating optocoupler, and a second TRIAC in electrical connection,
wherein the second multiple pin cable is configured to electrically connect the first enclosure at a third multiple pin connector to the second enclosure via the fourth multiple pin connector,
wherein the second enclosure is configured to be controlled by the microcontroller in the second IC board, and
wherein the third IC board, the second IC board, and the wall switch via the wall adapter are configured to control the second isolating optocoupler and the third isolating optocoupler and the first TRIAC and second TRIAC that are connected to the first and second controlled receptacles in respective first and second enclosures in order to turn the electrical control system on and off.

17. The electrical control system of claim 16, wherein the first enclosure further comprises a first synchronizing push button and the second enclosure further comprises a second synchronizing push button,
wherein an each of the first synchronizing push button and the second synchronizing push button is a system power control button and part of a synchronizing circuit configured to synchronize the electrical control system to a default system power amount upon being pressed by a user; and
wherein each of the first push button and the second push button is a local button configured to control a respective controlled receptable of a respective enclosure without affecting that of another enclosure.

18. An electrical control system configured to control an electrical device from two or more locations with independent control function, the electrical control system comprising:
a wall adapter comprising a first set of polarized male plugs and a first integrated circuit (IC) board, wherein the first set of polarized male plugs is configured to provide electrical connection with a wall receptacle controlled by a single-pole wall switch,
wherein the first IC board comprises a first isolating optocoupler, a first dual FLIP-FLOP logic gate, a first quad NAND Schmitt trigger logic gate, a pulse generator, and a first multiple pin connector in electrical connection, and
wherein the first IC board is configured to convert a 110 vac latched signal in the wall receptacle to a 5 vdc momentary signal via the first isolating optocoupler;
a first enclosure comprising a first push button in electrical connection with the wall adapter, a first 110 vac power cord, a first 5 vdc power supply, a first uncontrolled receptacle, a first controlled receptacle, a first multiple pin cable, a second multiple pin connector, and a second IC board,
wherein the first multiple pin cable is configured to electrically connect the first enclosure at the second multiple pin connector to the wall adapter via the first multiple pin connector,
wherein the second IC board comprises a second isolating optocoupler, a first TRIAC, a second dual FLIP-FLOP logic gate, a second quad NAND Schmitt trigger logic gate, a number of resistors, and multiple diodes in electrical connection with the first controlled receptacle, and
wherein the first 110 vac power cord is connected at a first end to an uncontrolled power source and at a second end to the first 5 vdc power supply via the first uncontrolled receptacle; and
a second enclosure, wherein the second enclosure comprises a second push button, a second 110 vac power cord, a second multiple pin cable, a second uncontrolled receptacle, and a second controlled receptacle in electrical connection with a third IC board,
wherein the third IC board comprises a third dual FLIP-FLOP logic gate, a third quad NAND Schmitt trigger logic gate, a third isolating optocoupler, and a second TRIAC in electrical connection;
wherein the second multiple pin cable is configured to electrically connect the first enclosure at a third multiple pin connector to the second enclosure via the fourth multiple pin connector, and
wherein the third IC board, the second IC board, and the wall switch via the wall adapter are configured to control the second isolating optocoupler and the third isolating optocoupler, and the first TRIAC and second TRIAC that are connected to the first and second controlled receptacles in respective first and second enclosures in order to turn the electrical control system on and off.

19. The electrical control system of claim 18, wherein the first enclosure further comprises a first synchronizing push button and the second enclosure further comprises a second synchronizing push button,
  wherein an each of the first synchronizing push button and the second synchronizing push button is a system power control button and part of a synchronizing circuit configured to synchronize the electrical control system to a default system power amount upon being pressed by a user; and
  wherein an each of the first push button and the second push button is a local button configured to control a respective controlled receptable of a respective enclosure without affecting that of another enclosure.

20. The electrical control system of claim 2, wherein the first multiple-pin connector and the second multiple-pin receptacle are configured to be connected wirelessly.

\* \* \* \* \*